United States Patent
Kim et al.

(10) Patent No.: US 9,996,658 B2
(45) Date of Patent: Jun. 12, 2018

(54) METHOD OF MANUFACTURING A SEMICONDUCTOR DEVICE

(71) Applicant: Samsung Electronics Co., Ltd., Suwon-si (KR)

(72) Inventors: Youngseok Kim, Incheon (KR); Noyoung Chung, Hwaseong-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days. days.

(21) Appl. No.: 15/433,835

(22) Filed: Feb. 15, 2017

(65) Prior Publication Data

US 2017/0329888 A1    Nov. 16, 2017

(30) Foreign Application Priority Data

May 13, 2016    (KR) .................. 10-2016-0058854

(51) Int. Cl.
*G06F 17/50*    (2006.01)
*G03F 1/36*    (2012.01)

(52) U.S. Cl.
CPC ............ *G06F 17/5081* (2013.01); *G03F 1/36* (2013.01)

(58) Field of Classification Search
CPC ............................ G06F 17/5081; G03F 1/36
See application file for complete search history.

(56) References Cited

U.S. PATENT DOCUMENTS

| | | | |
|---|---|---|---|
| 7,401,319 B2 * | 7/2008 | Horng | G06F 17/5072 250/492.22 |
| 7,673,280 B2 | 3/2010 | Kang | |
| 7,906,801 B2 * | 3/2011 | Becker | H01L 27/0207 257/206 |
| 8,181,127 B2 | 5/2012 | Yune et al. | |
| 8,392,854 B2 | 3/2013 | Kim et al. | |
| 8,458,627 B2 | 6/2013 | Taoka et al. | |
| 8,788,981 B2 | 7/2014 | Kijima et al. | |
| 2008/0178140 A1 | 7/2008 | Lin et al. | |

FOREIGN PATENT DOCUMENTS

| | | |
|---|---|---|
| KR | 10-0662961 B1 | 12/2006 |
| KR | 10-1275681 B1 | 1/2008 |
| KR | 10-0896856 B1 | 5/2009 |
| KR | 10-0896861 B1 | 5/2009 |
| KR | 10-2010-0033612 A | 3/2010 |
| KR | 10-2014-0030007 A | 3/2014 |

* cited by examiner

*Primary Examiner* — Naum B Levin
(74) *Attorney, Agent, or Firm* — Muir Patent Law, PLLC

(57) ABSTRACT

A method for manufacturing a semiconductor device includes obtaining a design layout for a target layer of an optical proximity correction process, the design layout including a first block and a second block being a repetition block of the first block, dividing the design layout into a plurality of patches, performing the optical proximity correction process on the patches of the first block, applying corrected patches of the first block to the patches of the second block, respectively, forming a correction layout by performing the optical proximity correction process on boundary patches of the second block, fabricating a photomask corresponding to the correction layout, and forming patterns on a substrate corresponding to the photomask. Each of the patches is a standard unit on which the optical proximity correction process is performed.

20 Claims, 22 Drawing Sheets

METHOD OF MANUFACTURING A SEMICONDUCTOR DEVICE

CROSS-REFERENCE TO RELATED APPLICATION

This U.S. non-provisional patent application claims priority under 35 U.S.C. § 119 to Korean Patent Application No. 10-2016-0058854, filed on May 13, 2016, in the Korean Intellectual Property Office, the disclosure of which is hereby incorporated by reference in its entirety.

BACKGROUND

Embodiments of the inventive concepts relate to a method for manufacturing a semiconductor device and, more particularly, to an optical proximity correction method and a method for manufacturing a semiconductor device using the same.

Semiconductor devices are widely used in an electronic industry because of their small sizes, multi-functional characteristics, and/or low manufacture costs. Semiconductor devices may be categorized as any one of semiconductor memory devices storing logical data, semiconductor logic devices processing logic data, and hybrid semiconductor devices having both the function of the semiconductor memory devices and the function of the semiconductor logic devices. Demands for semiconductor devices with excellent characteristics have been increasing with the development of the electronic industry. For example, demands for high-reliable, high-speed, and/or multi-functional semiconductor devices have been increasing rapidly. To address these demands, semiconductor devices have been becoming highly integrated and structures of semiconductor devices have been becoming more and more complicated.

Semiconductor devices may be manufactured using a photolithography process. A layout of patterns may be printed on a semiconductor substrate by the photolithography process. However, as semiconductor devices have been becoming highly integrated, a distance between image patterns of a mask have been reduced gradually. For example, the image patterns may be very close to each other because of reduced distance between them. Due to this proximity, interference and diffraction of light may occur to print a distorted layout, different from a desired layout, on a semiconductor substrate. Resolution enhancement technology (e.g., optical proximity correction) may be used to prevent the distortion of a layout.

SUMMARY

Embodiments of the inventive concepts may provide a method for manufacturing a semiconductor device, which is capable of reducing a performance time of optical proximity correction.

In an aspect, a method for manufacturing a semiconductor device may include obtaining a design layout for a target layer of an optical proximity correction process, the design layout including a first block and a second block being a repetition block of the first block, dividing the design layout into a plurality of patches, performing the optical proximity correction process on the patches of the first block, applying corrected patches of the first block to the patches of the second block, respectively, forming a correction layout by performing the optical proximity correction process on boundary patches of the second block, fabricating a photomask corresponding to the correction layout, and forming patterns on a substrate corresponding to the photomask. Each of the patches may be a standard unit on which the optical proximity correction process is performed.

In an aspect, a method for manufacturing a semiconductor device may include providing a design layout, the design layout including a first block and a second block being a repetition block of the first block, performing an optical proximity correction process on the first block to obtain an optical proximity correction (OPC) bias of the first block, applying the OPC bias to the second block to form a first correction layout, wherein a corrected layout of the second block and a corrected layout of the first block are substantially the same as each other or are symmetrical to each other, forming a second correction layout by performing an optical proximity correction process on a boundary portion of the second block and a remaining region of the first correction layout except the first and second blocks, fabricating a photomask corresponding to the second correction layout, and forming a pattern on a substrate corresponding to the photomask.

In an aspect, a method for manufacturing a semiconductor device may include dividing a design layout into a plurality of patches, the design layout including a first block and a second block being a repetition block of the first block, obtaining position information, rotation information, and symmetry information of the second block with respect to the first block, performing an optical proximity correction process on the patches of the first block, applying corrected patches of the first block to the patches of the second block, respectively, by using the position information, the rotation information, and the symmetry information, forming a correction layout by performing an optical proximity correction process on boundary patches of the second block, fabricating a photomask corresponding to the correction layout, and forming patterns on a substrate corresponding to the photomask.

In an aspect, a method for manufacturing a semiconductor device may include providing a design layout, the design layout including a first block and a second block; dividing the design layout into a plurality of patches; determining whether the second block is a repetition block of the first block based on verifying positional, rotational, and symmetric relations between the first block and the second block; performing an optical proximity correction process on the patches of the first block; applying corrected patches of the first block to the patches of the second block, respectively, by using the verified positional, rotational, and symmetric relations between the first block and the second block; forming a correction layout by performing an optical proximity correction process on boundary patches of the second block; fabricating a photomask corresponding to the correction layout; and forming patterns on a substrate corresponding to the photomask.

BRIEF DESCRIPTION OF THE DRAWINGS

Some embodiments will be more clearly understood from the following brief description taken in conjunction with the accompanying drawings. The accompanying drawings represent non-limiting, some embodiments as described herein.

DETAILED DESCRIPTION OF THE EMBODIMENTS

Figure 1:
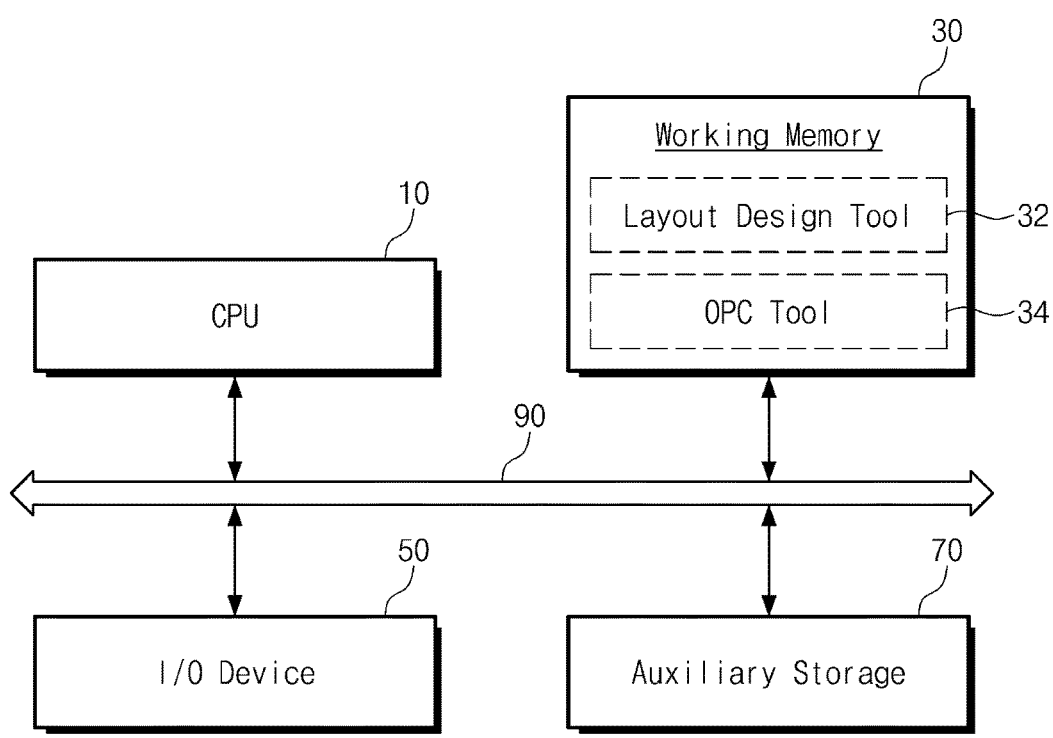
FIG. 1 is a schematic block diagram illustrating a computer system for performing a semiconductor design process, according to some exemplary embodiments of the inventive concepts.

The present disclosure now will be described more fully hereinafter with reference to the accompanying drawings, in which various embodiments are shown. The invention may, however, be embodied in many different forms and should not be construed as limited to the example embodiments set forth herein. These example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention.

In the drawings, the size and relative sizes of layers and regions may be exaggerated for clarity. Like numbers refer to like elements throughout. Though the different figures show variations of exemplary embodiments, these figures are not necessarily intended to be mutually exclusive from each other. Rather, as will be seen from the context of the detailed description below, certain features depicted and described in different figures can be combined with other features from other figures to result in various embodiments, when taking the figures and their description as a whole into consideration.

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to emphasize this meaning, unless the context or other statements indicate otherwise. For example, items described as "substantially the same," "substantially equal," or "substantially planar," may be exactly the same, equal, or planar, or may be the same, equal, or planar within acceptable variations that may occur, for example, due to manufacturing processes.

Terms such as "about" or "approximately" may reflect amounts, sizes, orientations, or layouts that vary only in a small relative manner, and/or in a way that does not significantly alter the operation, functionality, or structure of certain elements.

Unless otherwise defined, all terms (including technical and scientific terms) used herein have the same meaning as commonly understood by one of ordinary skill in the art to which this disclosure belongs.

FIG. 1 is a schematic block diagram illustrating a computer system for performing a semiconductor design process, according to some exemplary embodiments of the inventive concepts. Referring to FIG. 1, a computer system may include a central processing unit (CPU) 10, a working memory 30, an input/output (I/O) device 50, and an auxiliary memory device 70. In some embodiments, the computer system may be a customized system for performing a layout design process according to some embodiments of the inventive concepts. In addition, the computer system may be configured to execute various design and check simulation programs.

The CPU 10 may be configured to run a variety of software (e.g., application programs, operating systems, and device drivers) in the computer system. In some embodiments, the CPU 10 may be configured to run an operating system (not shown) loaded on the working memory 30. In addition, the CPU 10 may be configured to run various application programs on the operating system. For example, the CPU 10 may be configured to run a layout design tool 32 loaded on the working memory 30.

The operating system (OS) or application programs may be loaded on the working memory 30. For example, when the computer system starts a booting operation, an OS image (not shown) stored in the auxiliary memory device 70 may be loaded on the working memory 30 based on a booting sequence. In the computer system, overall input/output operations may be managed by the operating system. Likewise, some application programs, which may be selected by a user or be provided for basic services, may be loaded on the working memory 30. In particular, the layout design tool 32 prepared for a layout design process of some embodiments may be loaded from the auxiliary memory device 70 onto the working memory 30.

The layout design tool 32 may provide a bias function for changing or modifying shapes and positions, defined by a resign rule, of specific layout patterns. In addition, the layout design tool 32 may perform a design rule check (DRC) under the changed condition obtained by the bias function. The working memory 30 may include at least one of a volatile memory device (e.g., a static random access memory (SRAM) device or a dynamic random access memory (DRAM) device) or a non-volatile memory device (e.g., a PRAM device, a MRAM device, a ReRAM device, a FRAM device, a NOR flash memory device).

In addition, an optical proximity correction (OPC) tool 34 may be loaded on the working memory 30 to perform an optical proximity correction (OPC) process on the designed layout data.

The I/O device 50 may be configured to control input and output operations of user interface devices. For example, the I/O device 50 may include a keyboard or a monitor and may receive relevant information from a designer. By using the I/O device 50, the designer may receive information on semiconductor regions or data paths which require adjusted operating characteristics. The I/O device 50 may be configured to display a progress status or a process result of the OPC tool 34.

The auxiliary memory device 70 may serve as a storage medium for the computer system. The auxiliary memory device 70 may store application programs, an OS image, and various data. The auxiliary memory device 70 may be provided in the form of at least one of a memory card (e.g., MMC, eMMC, SD, or MicroSD) or a hard disk drive (HDD). The auxiliary memory device 70 may include a NAND flash memory device having a large memory capacity. Alternatively, the auxiliary memory device 70 may include at least one of next-generation non-volatile memory devices (e.g., PRAM, MRAM, ReRAM, or FRAM) or NOR flash memory devices.

A system interconnector 90 may serve as a system bus for realizing a network in the computer system. The CPU 10, the working memory 30, the I/O device 50, and the auxiliary memory device 70 may be electrically connected to each other through the system interconnector 90, and thus, data may be exchanged therebetween. However, the system interconnector 90 may not be limited to the aforementioned configuration. In certain embodiments, the system interconnector 90 may further include an additional element for increasing efficiency in data communication.

Figure 2:
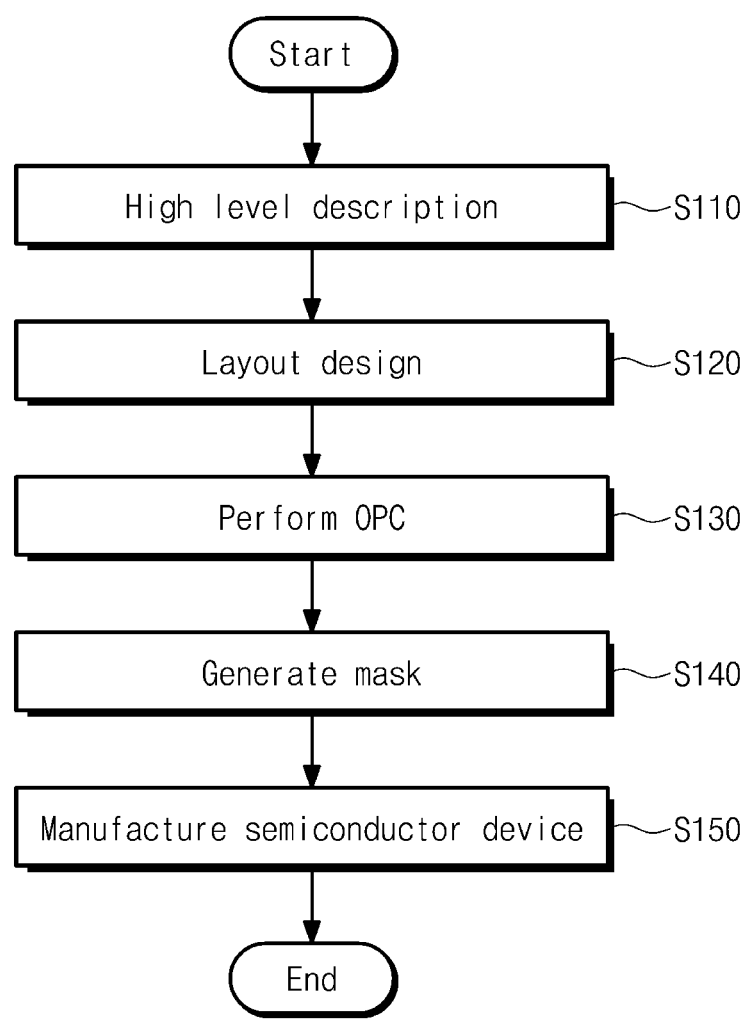
FIG. 2 is a flow chart illustrating a method for designing and manufacturing a semiconductor device, according to some exemplary embodiments of the inventive concepts.

FIG. 2 is a flow chart illustrating a method for designing and manufacturing a semiconductor device, according to some exemplary embodiments of the inventive concepts.

Referring to FIG. 2, a high-level design process of a semiconductor integrated circuit may be performed using the computer system described with reference to FIG. 1 (S110). For example, in the high-level design process, an integrated circuit to be designed may be described in terms of high-level computer language (e.g., C language). Circuits designed by the high-level design process may be more concretely described by a register transfer level (RTL) coding or a simulation. In addition, codes generated by the RTL coding may be converted into a netlist, and the results may be combined with each other to realize an entire semiconductor device. The combined schematic circuit may be verified by a simulation tool. In certain embodiments, an adjusting operation may be further performed in consideration of a result of the verification operation.

A layout design process may be performed to realize a logically completed semiconductor integrated circuit on a silicon substrate (S120). For example, the layout design process may be performed based on the schematic circuit prepared in the high-level design process or the netlist corresponding thereto. The layout design process may include a routing operation of placing and connecting various standard cells that are provided from a cell library, based on a predetermined design rule.

The cell library for the layout design process may contain information on operation, speed, and power consumption of the standard cells. In certain embodiments, a cell library for representing a layout of a circuit having a specific gate level may be defined in the layout design tool. Here, the layout may be prepared to define or describe shapes and sizes of patterns constituting transistors and metal interconnection lines, which will be actually formed on a silicon substrate. For example, layout patterns (e.g., PMOS, NMOS, N-WELL, gate electrodes, and metal interconnection lines thereon) may be suitably disposed to actually form an inverter circuit on a silicon substrate. For this, at least one of inverters defined in the cell library may be selected.

In addition, the routing operation may be performed on selected and disposed standard cells. In detail, the routing operation may be performed on the selected and disposed standard cells to connect them to upper interconnection lines. By the routing operation, the standard cells may be electrically connected to each other to meet a design. These operations may be automatically or manually performed in the layout design tool. In certain embodiments, an operation of placing and routing the standard cells may be automatically performed by an additional place & routing tool.

After the routing operation, a verification operation may be performed on the layout to check whether there is a portion violating the given design rule. In some embodiments, the verification operation may include evaluating verification items, such as a design rule check (DRC), an electrical rule check (ERC), and a layout vs schematic (LVS). The evaluating of the DRC item may be performed to evaluate whether the layout meets the given design rule. The evaluating of the ERC item may be performed to evaluate whether there is an issue of electrical disconnection in the layout. The evaluating of the LVS item may be performed to evaluate whether the layout is prepared to coincide with the gate-level netlist.

An optical proximity correction (OPC) process may be performed (S130). The layout patterns obtained by the layout design process may be realized on a silicon substrate by a photolithography process. The OPC process may be performed to correct optical proximity effect which may occur in the photolithography process. The optical proximity effect may be an unintended optical effect (such as refraction or diffraction) which may occur in the photolithography process. For example, a distortion phenomenon of layout patterns, which may be caused by the optical proximity effect, may be corrected by the OPC process. The designed shapes and positions of the designed layout patterns may be slightly changed or biased by the OPC process. The optical proximity correction (OPC) process will be described later in more detail with reference to FIGS. 3 to 8.

A photomask may be manufactured based on the layout modified by the OPC process (S140). In general, the photomask may be manufactured by patterning a chromium layer provided on a glass substrate, using the layout pattern data.

A semiconductor device may be manufactured using the manufactured photomask (S150). Various exposure processes and etching processes may be repeated in the manufacture of the semiconductor device using the photomask. By these processes, shapes of patterns obtained in the layout design process may be sequentially formed on a silicon substrate.

Figure 3:
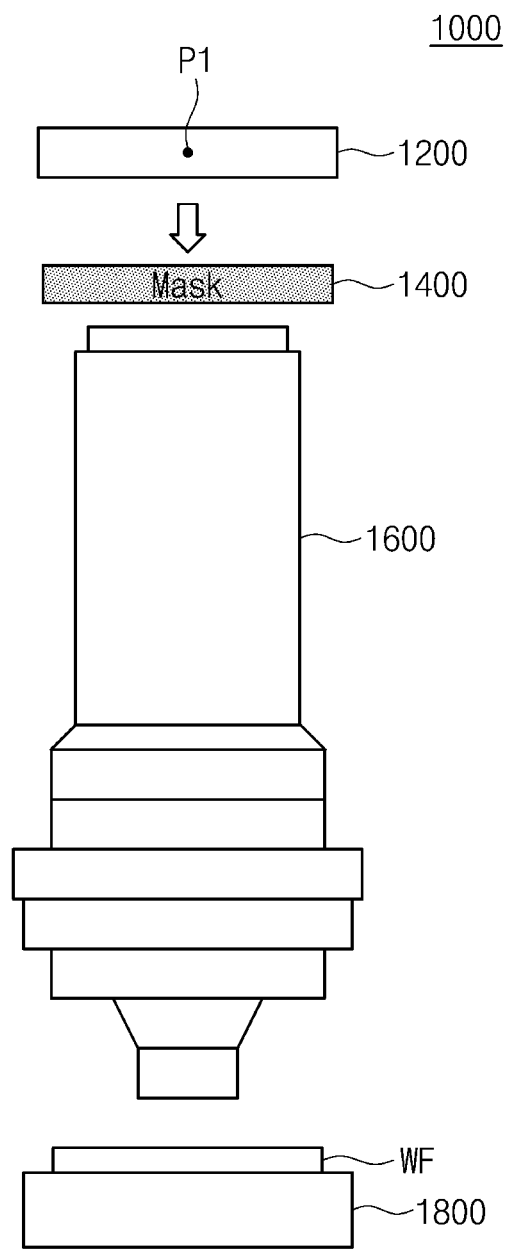
FIG. 3 is a conceptual diagram illustrating a photolithography system using a photomask manufactured according to some exemplary embodiments of the inventive concepts.

FIG. 3 is a conceptual diagram illustrating a photolithography system using a photomask manufactured according to some exemplary embodiments of the inventive concepts. A photolithography system 1000 may include a light source 1200, a photomask 1400, a reduction projection device 1600, and a substrate stage 1800. However, the photolithography system 1000 may further include components not shown in FIG. 3. In some embodiments, the photolithography system 1000 may further include a sensor (not shown) used to measure a height and a gradient of a surface of a substrate WF.

The light source 1200 may emit light. The light emitted from the light source 1200 may be irradiated or provided to the photomask 1400. In some embodiments, a lens may be provided between the light source 1200 and the photomask to adjust a focus of light. The light source 1200 may include an ultraviolet light source (e.g., a KrF light source having a wavelength of 234 nm or an ArF light source having a wavelength of 193 nm). The light source 1200 may include one point light source P1. However, embodiments of the inventive concepts are not limited thereto. In certain embodiments, the light source 1200 may include a plurality of point light sources.

To print (realize) a designed layout onto a substrate WF, the photomask 1400 may include image patterns. The image patterns may include one or more transparent regions and one or more opaque regions. The transparent regions may be formed by etching a metal layer (e.g., a chromium layer) on the photomask layer 1400. The transparent regions may transmit light emitted from the light source 1200. In some embodiments, the opaque regions may not transmit light but may block light.

The reduction projection device 1600 may receive light transmitted through the transparent regions of the photomask 1400. The reduction projection device 1600 may match layout patterns, to be printed onto the substrate WF, with the image patterns of the photomask 1400. The substrate stage 1800 may support the substrate WF. For example, the wafer stage 1800 may be a physical structure that holds the wafer WF in a desired position while the layout is printed on the wafer WF. In some embodiments, the substrate WF may be a silicon wafer.

Although not shown in FIG. 1, the reduction projection device 1600 may include an aperture. The aperture may be used to increase a depth of a focus of ultraviolet light emitted from the light source 1200. For example, the aperture may include a dipole aperture or a quadruple aperture. In some embodiments, the reduction projection device 1600 may further include a lens for adjusting a focus of light.

The transparent regions included in the image patterns of the photomask 1400 may transmit light emitted from the light source 1200. Light transmitted through the photomask 1400 may be irradiated to the substrate WF through the reduction projection device 1600. Thus, patterns corresponding to the image patterns of the photomask 1400 may be printed onto the substrate WF.

In some embodiments, as an integration degree of a semiconductor device increases, the image patterns of the photomask 1400 become closer to each other and widths of the transparent regions become much narrower. Due to this proximity between transparent regions, interference and diffraction of light may occur to print a distorted layout, different from a desired layout, onto the substrate WF. If the distorted layout is printed on the substrate WF, a designed circuit may operate abnormally.

A resolution enhancement technology may be used to prevent the distortion of the layout. The optical proximity correction process (see S130 of FIG. 2) is an example of a resolution enhancement technology. According to the optical proximity correction process, a degree of the distortion such as the interference and diffraction of light may be predicted. In addition, based on the predicted result, image patterns to be formed on the photomask 1400 may be biased in advance. Thus, a desired layout may be printed on the substrate WF.

According to some embodiments of the inventive concepts, the optical proximity correction process may be performed to adjust or modify a layout for a single layer. In semiconductor manufacturing processes, a semiconductor device may be realized to include a plurality of layers. In some embodiments, a semiconductor device may include a plurality of stacked metal layers to realize a specific circuit. In some embodiments, the optical proximity correction process may be independently performed on each of the plurality of layers.

Figure 4:
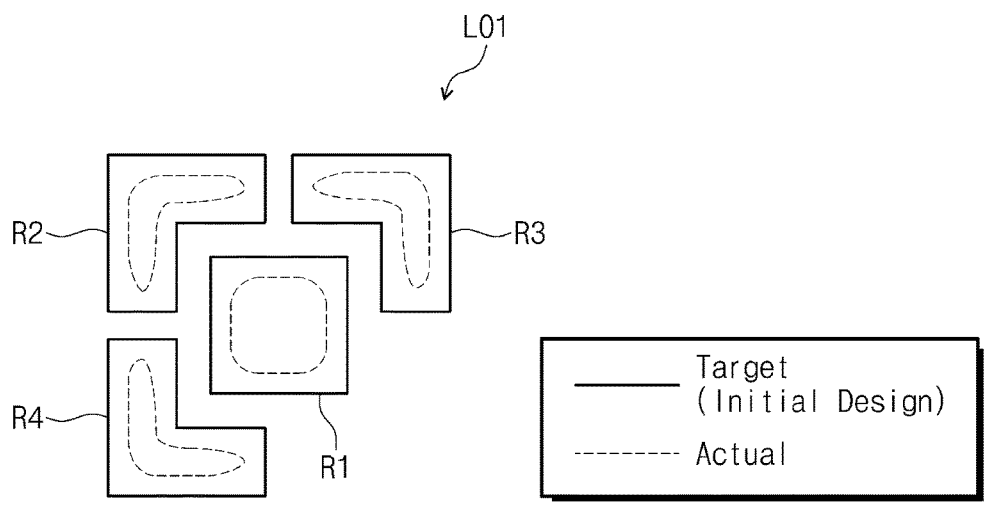
FIG. 4 is a conceptual diagram illustrating a layout according to some exemplary embodiments of the inventive concepts.

FIG. 4 is a conceptual diagram illustrating an exemplary layout according to some embodiments of the inventive concepts. A full line of FIG. 4 shows a desired layout (e.g., target layout) to be printed on the substrate WF of FIG. 3 and a dotted line of FIG. 4 shows a real layout (e.g., actual layout) that is actually printed on the substrate WF of FIG. 3.

A design layout LO1 may include first circuit pattern R1, a second circuit pattern R2, a third circuit pattern R3, and a fourth circuit pattern R4. A shape or form of the design layout LO1 of FIG. 4 is illustrated as an example. However, the number of circuit patterns and the shape or form of the layout LO1, as illustrated in FIG. 4, is an example to help better understanding, and is not intended to limit the present disclosure.

In some example embodiments, the full lines of the first circuit pattern R1 to fourth circuit pattern R4 illustrated in FIG. 4 may be the desired layout and may show a layout to be printed onto the substrate WF of FIG. 3. The desired layout may be provided as an initial design layout. For example, the solid lines of FIG. 4 may correspond to a layout to be printed as a target layout. The target layout may be provided as an "initial" design layout. For example, a designer may provide the target layout, represented as the solid lines of layout LO1, as the initial design layout for printing on the wafer WF. The design layout LO1 may be relative to the image patterns of the photomask 1400 of FIG. 3 to print the target layout on the wafer WF.

However, the photomask 1400 may cause distortion, such as optical interference and optical diffraction. When the photomask 1400 includes image patterns simply corresponding to the full lines (e.g., solid lines) of FIG. 4, the first circuit pattern R1 to the fourth circuit pattern R4 may be actually realized like the dotted lines of FIG. 4 on the substrate WF due to the distortion. As illustrated in FIG. 4, the dimensions and shapes of the image patterns actually printed on the wafer WF (shown by the dotted lines) can be different from the dimensions and shapes that are desired or intended to be printed on the wafer WF (shown by the full lines). If a distorted layout corresponding to the dotted lines of FIG. 4 is printed on the substrate WF, a designed circuit may operate abnormally or in a manner different from its intended operation.

The optical proximity correction process may be performed to prevent the distortion of the layout. In the optical proximity correction process, the design layout may be biased to reduce an error between the real layout and the desired layout. For example, a design layout including biasing may reduce differences in shape and dimension between the desired layout and the real printed layout. The biasing may be based on predicted distortion caused by optical interference and optical diffraction. Thus, the photomask 1400 may include image patterns corresponding to the biased design layout. When a photolithography process is performed using the photomask 1400, a substantially same real layout as the initial design layout (i.e., the desired layout) may be printed on the substrate WF. For example, the real layout having a relatively small error (or within an acceptable threshold of differences) as compared to the initial design layout may be printed on the substrate WF.

Figure 5:
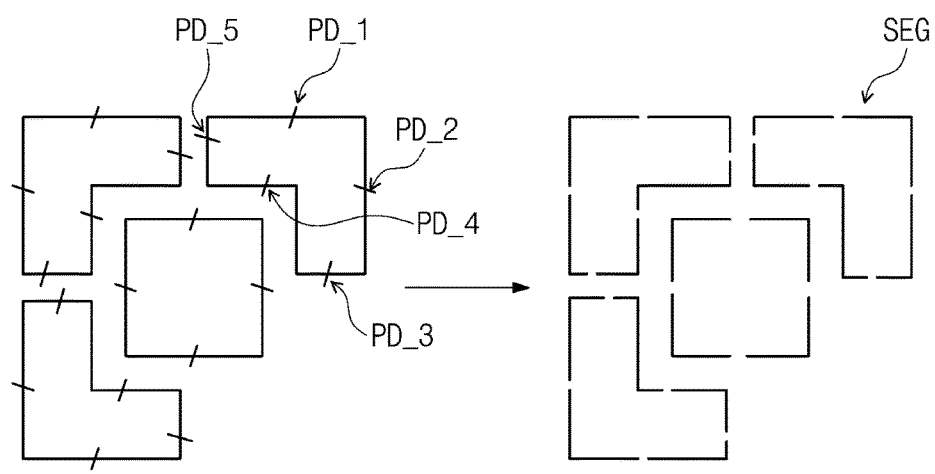
FIG. 5 is a conceptual diagram illustrating a process of dividing a design layout corresponding to the layout of FIG. 4 into a plurality of segments in an optical proximity correction process.

FIG. 5 is a conceptual diagram illustrating a process of dividing an outline of a design layout corresponding to the layout LO1 of FIG. 4 into a plurality of segments in certain exemplary embodiments of an optical proximity correction process.

Referring to FIG. 5, a plurality of division points may be set on a contour (or outline or perimeter) of one or more circuit patterns of the design layout. The plurality of division points may be positions or locations along the contour (or outline or perimeter of the one or more circuit patterns. For example, in some embodiments, in the example of FIG. 5, the third circuit pattern R3 may include a first division point PD_1, a second division point PD_2, a third division point PD_3, a fourth division point PD_4, and fifth division point PD_5 located along the contour of the design layout. One segment SEG may be obtained based on the first division point PD_1 and the second division point PD_2. Likewise, the contour of the design layout may be divided into a plurality of segments, based on the plurality of division points. For example, the contour of the design layout for the first circuit pattern R1, the second circuit pattern R2, and the fourth circuit pattern R4 may be divided into a plurality of segments based on a plurality of division points. In some embodiments, the plurality of segments may include segments extending between each of the adjacent ones of the first division point PD_1, the second division point PD_2, the third division point PD_3, the fourth division point PD_4, and the fifth division point PD_5. Additionally, and/or alternatively, the plurality of segments may include segments extending between each of the adjacent ones of the first division point PD_1, the second division point PD_2, the third division point PD_3, the fourth division point PD_4, the fifth division point and/or features of the design layout (e.g., corners or other acute angles, etc.).

Although the terms "divide" and "division" are used herein, these terms may not mean physically dividing or a physical division. In some embodiments, the division of a segment may refer to defining one or more sections or portions of the contours or perimeters or outlines of circuit patterns in a design layout. For example, while the plurality of segments is illustrated as being physically divided in FIG. 5, the segments may remain physically connected or contiguous. The illustration is provided for better understanding of the disclosed concepts.

In some exemplary embodiments, in an optical proximity correction process, each of the divided segments may be a target to be biased. Each of the divided segments may be independently and/or differently biased. For example, one segment SEG may be biased in a first direction (e.g., a positive direction or an outward direction) or a second direction (e.g., a negative direction or an inward direction), independently of other segments. In some embodiments, a segment SEG may not be biased in either of the first direction (e.g., a positive direction or an outward direction) or the second direction (e.g., a negative direction or an inward direction). As used herein, biasing may include, for example, moving the outside edges corresponding to the divided segments in one of the first direction or the second direction. Each of the divided segments may be biased to reduce an error between a real layout and the desired layout. The divided segments may be biased by the OPC tool 34 of FIG. 1. An example of a layout obtained based on the biased segments is illustrated in FIG. 6.

Figure 6:
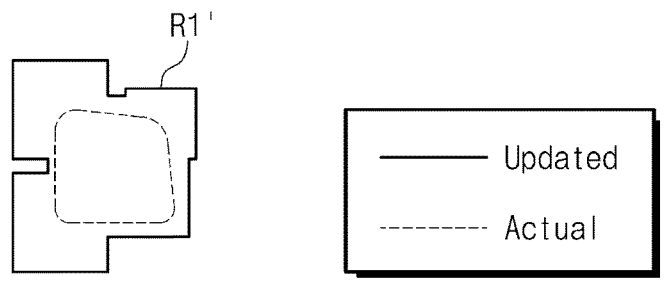
FIG. 6 is a conceptual diagram illustrating a layout corrected by the optical proximity correction process of FIG. 5.

FIG. 6 is a conceptual diagram illustrating a layout corrected by the optical proximity correction process of FIG. 5.

Referring to FIG. 6, a first correction pattern R1' corrected from the first circuit pattern R1 of FIG. 4 may be provided. Descriptions to the second circuit pattern R2 to the fourth circuit pattern R4 of FIG. 4 will be omitted for the purpose of ease and convenience in explanation. As described with reference to FIG. 5, the contour of the first circuit pattern R1 of FIG. 4 may be divided into a plurality of segments, and one or more of the plurality of the divided segments may be biased. As illustrated in FIG. 6, each of the segments may be biased in the first direction (e.g., the positive direction or the outward direction) or the second direction (e.g., the negative direction or the inward direction). In some embodiments, one or some of the segments may not be biased. For example, at least one of the segments may be biased. Thus, the first correction pattern R1' may be obtained as a result of this biasing. In some embodiments, a desired bias (e.g., positive, negative, none) for each of the segments of the first circuit pattern R1 may be determined, and each of the segments may be shifted or moved in accordance with the desired bias (e.g., shifted in one of a positive direction, a negative direction). In some cases, where at least one segment is shifted or moved in a direction, another segment may not be shifted or moved at all.

A dotted line of FIG. 6, according to this exemplary embodiment, shows a real layout that will be actually printed using the corrected design layout on the substrate WF of FIG. 3. Since at least one or each of the divided segments is biased, an error between the real layout and the desired layout may be reduced.

Figure 7:
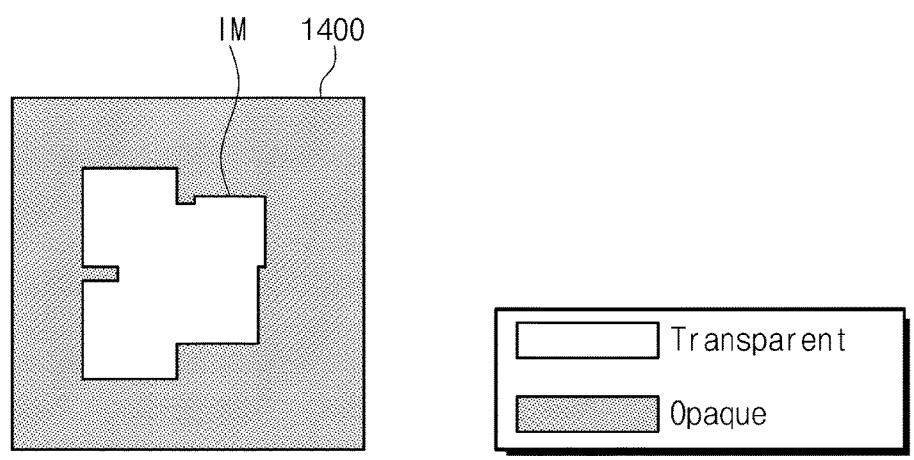
FIG. 7 is a conceptual diagram illustrating a photomask manufactured based on the corrected layout of FIG. 6.

FIG. 7 is a conceptual diagram illustrating a photomask (or simply, a mask) manufactured based on the corrected layout of FIG. 6. In some embodiments, as illustrated in FIG. 7, a photomask 1400 may include an image pattern IM corresponding to the first correction pattern R1' of FIG. 6. The photomask 1400 may include a transparent region and an opaque region. The opaque region may not transmit light but may block light. In some embodiments, the transparent region may transmit light emitted from the light source 1200 of FIG. 3. Light transmitted through the photomask 1400 may be irradiated to a top surface of the substrate WF of FIG. 3. The image pattern IM may form the transparent region.

Figure 8:
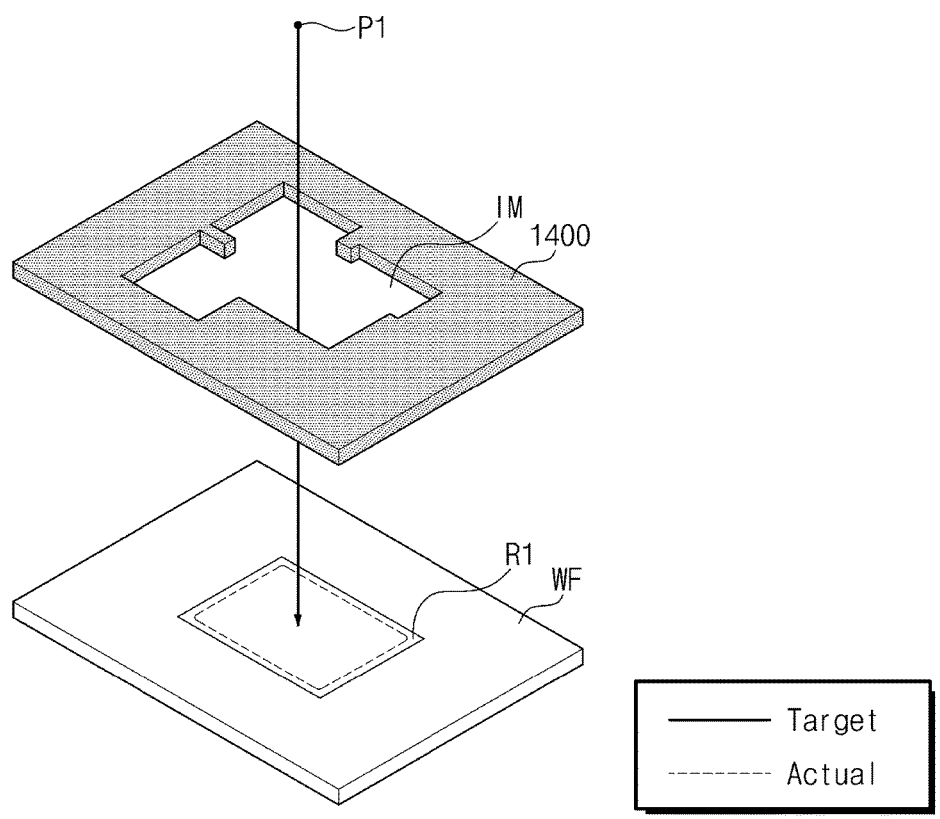
FIG. 8 is a conceptual diagram illustrating a process of printing a circuit pattern on a substrate by using the photomask of FIG. 7.

FIG. 8 is a conceptual diagram illustrating a process of printing a circuit pattern on a substrate by using the photomask of FIG. 7 according to some example embodiments.

The point light source P1 included in the exemplary light source 1200 of FIG. 3 may emit light to the photomask 1400. The emitted light may pass through the transparent region of the image pattern IM and may be then irradiated to the substrate WF. Thus, a first circuit pattern R1 corresponding to the image pattern IM may be printed onto the substrate WF.

When the photomask 1400 includes the image pattern IM, a real layout which is the substantially same as the desired layout (i.e., has a small error or being with an acceptable threshold) may be printed on the substrate WF. The desired layout is shown by a full line and the real layout is shown by a dotted line in FIG. 8. As a result, the optical proximity correction process may be performed to fabricate the photomask 1400 including the biased image patterns IM and to reduce the error between the real layout and the desired layout.

Figure 9:
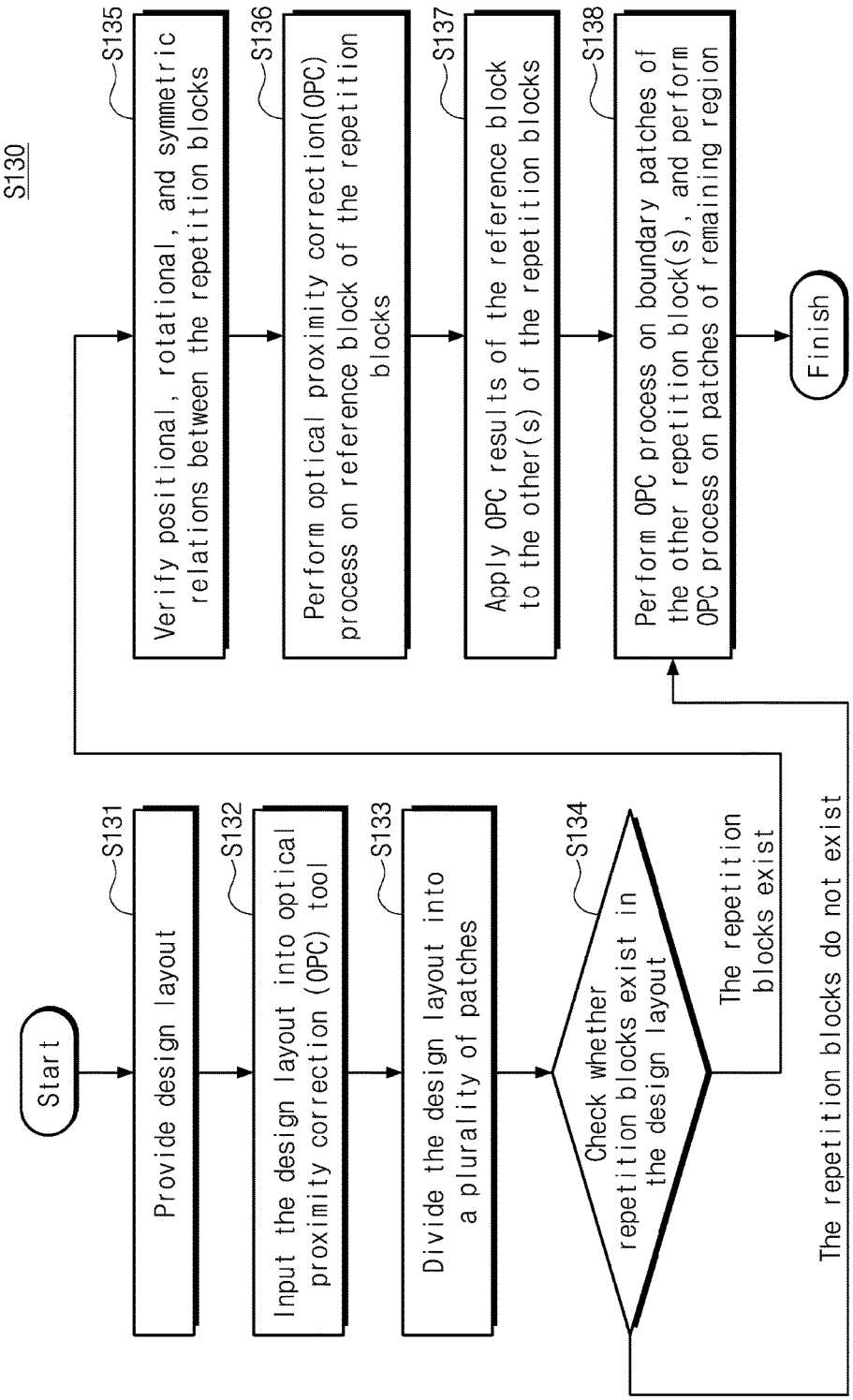
FIG. 9 is a flow chart illustrating an optical proximity correction method according to some exemplary embodiments of the inventive concepts.

FIG. 9 is a flow chart illustrating an optical proximity correction method according to some exemplary embodiments of the inventive concepts. FIGS. 10, 12, 13, 14, and 15 are diagrams illustrating layouts for explaining the optical proximity correction method of FIG. 9. FIG. 11 is a schematic block diagram illustrating an optical proximity correction tool for performing an optical proximity correction method according to some embodiments of the inventive concepts. FIG. 9 is a flow chart to explain the optical proximity correction process S130 in more detail.

Figure 10:
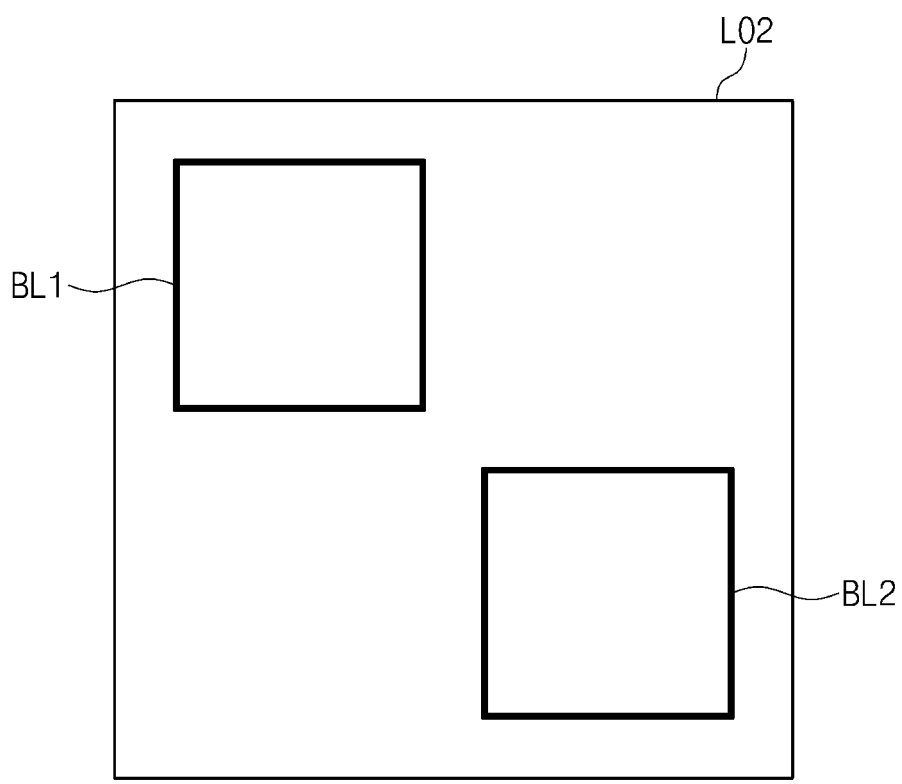
FIGS. 10, 12, 13, 14, and 15 are diagrams illustrating layouts for explaining the optical proximity correction method of FIG. 9.
Figure 11:
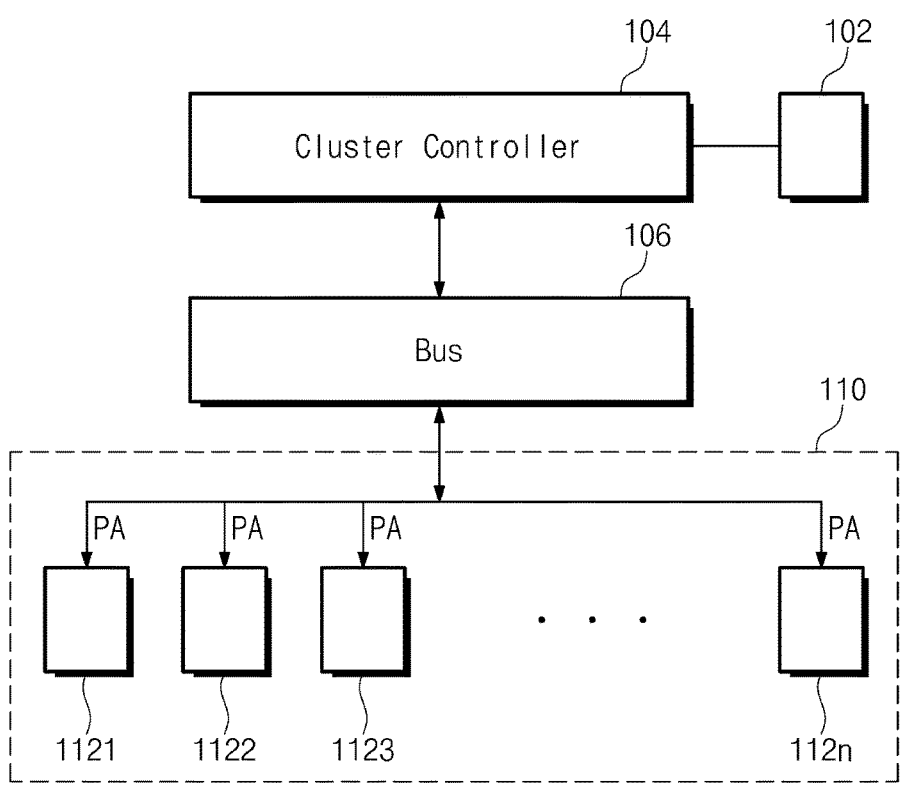
FIG. 11 is a schematic block diagram illustrating an optical proximity correction tool for performing an optical proximity correction method according to some exemplary embodiments of the inventive concepts.

Referring to FIGS. 9 and 10, a design layout LO2 may be provided (S131). The design layout LO2 may be a result of the layout design process S120 described with reference to FIG. 1. Even though not shown in the drawings, the design layout LO2 may include a plurality of circuit patterns, as described with reference to FIG. 4.

In some embodiments, the design layout LO2 may include a first block BL1 and a second block BL2. The second block BL2 may be a repeated block of the first block BL1. For example, the second block BL2 may be the same as the first block BL1. In this case, shapes and arrangement of circuit patterns in the first block BL1 may be the same as shapes and arrangement of circuit patterns in the second block BL2. Alternatively, the second block BL2 and the first block BL1 may be symmetric. In this case, shapes and arrangement of circuit patterns in the first block BL1 and shapes and arrangement of circuit patterns in the second block BL2 may be symmetric.

Information on the first and second blocks BL1 and BL2 being the repetition blocks may be provided in layout design data when the design layout LO2 is provided (S131). For example, the information on the repetition blocks may be provided into the layout design data in the layout design process S120 described with reference to FIG. 1.

Figure 12:
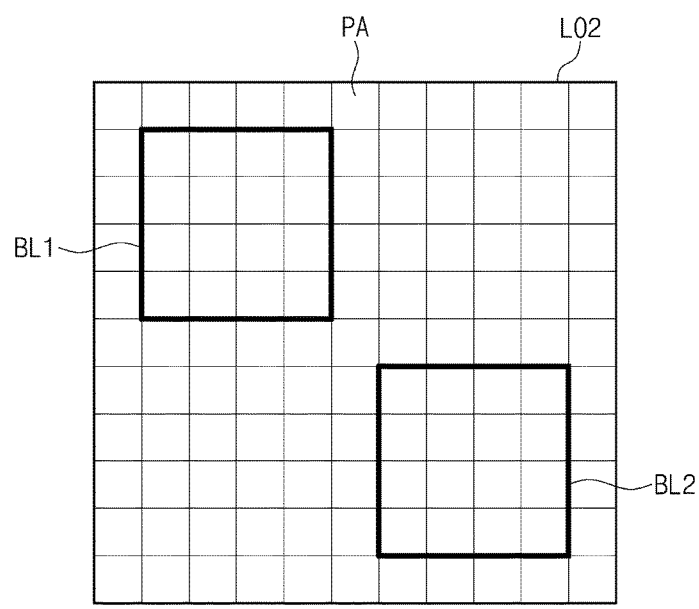

Referring to FIGS. 9, 11, and 12, the design layout LO2 may be inputted into the OPC tool 34 (S132). First, an example of the OPC tool 34 of FIG. 1 will be described in detail. The OPC tool 34 may include a data storage device 102, a cluster controller 104, a bus 106, and a processing system 110. The processing system 110 may include a plurality of nodes 1121, 1122, 1123, . . . , 112n where "n" is a natural number. In some embodiments, the nodes 1121 to 112n may be process cores processing data. In certain embodiments, the nodes 1121 to 112n may be modules and/or functions in software. In certain embodiments, the nodes 1121 to 112n may be specific circuits for performing the OPC process.

The design layout LO2, e.g., as illustrated in FIG. 12, may be divided into a plurality of patches PA by using the OPC tool 34 (S133). In some embodiments, a design hierarchy may be read out from the layout design data provided from the data storage device 102 by using the OPC tool 34, and the read design hierarchy may be analyzed by the OPC tool 34. Thereafter, the design layout LO2 may be divided into the plurality of patches PA on the basis of a kind of a unit element and proximity environment. The patches PA may have sizes that can be provided in the nodes 1121 to 112n of the OPC tool 34, respectively. For example, each of the patches PA may be a standard unit to which the optical proximity correction process is performed.

In some embodiments, a division criterion of the plurality of patches PA may include geometric information included in each of the patches PA, e.g., two-dimensional data such as a polygonal shape of a circuit pattern, a length of an edge of the circuit pattern, a direction of the circuit pattern, a size of the circuit pattern, and/or a ratio of a space to a circuit pattern portion.

In some embodiments, each of the patches PA may have a quadrilateral region having any size set by a user. Unlike FIG. 12, the patches PA may have shapes different from each other and sizes different from each other. In some embodiments, each of the patches PA may define one region of circuit patterns to be printed later on a substrate. The one region of the substrate may be a quadrilateral region of which a length of one edge may range from about 1 μm to about 99 μm. However, this size may be changed according to a set value of the user, as described above. In some embodiments, each of the first and second blocks BL1 and BL2 may consist of at least nine patches PA. In the exemplary embodiment as illustrated in FIG. 12, each of the first and second blocks BL1 and BL2 may include sixteen patches PA, but the disclosure is not limited thereto.

Figure 13:
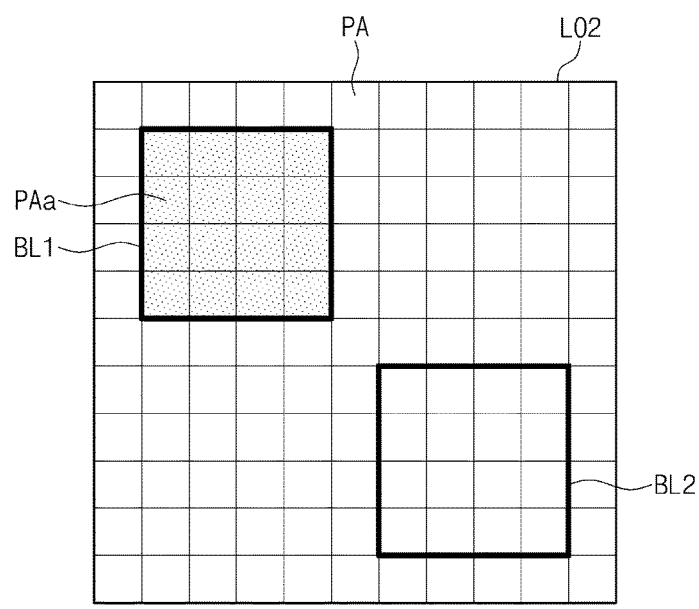

Referring to FIGS. 9 and 13, whether the repetition blocks exist in the design layout LO2 may be checked (S134). In this exemplary embodiment, each of the repetition blocks BL1 and BL2 may include the same number of patches PA and shapes and arrangement of circuit patterns in the first block BL1 as the patches PA and shapes and arrangement of circuit patterns in the second block BL2. As described above, the information on the repetition blocks may be included in the layout design data. Thus, the step S134 may check whether the information on the repetition blocks exists in the layout design data. As a result, it may be checked or verified that the first block BL1 and the second block BL2 are the repetition blocks.

Unlike FIG. 13, if the repetition blocks do not exist in the design layout LO2, the optical proximity correction process may be performed on each of the patches PA of the design layout LO2 (S138).

Position relation, rotation relation, and symmetric relation between the repetition blocks may be verified (S135). For example, a first information on a position of the second block BL2 with respect to the first block BL1 may be obtained. A second information on a rotation degree of the second block BL2 with respect to the first block BL1 may be obtained. A third information on the symmetric relation between the first and second blocks BL1 and BL2 with respect to the first block BL1 may be obtained. In the present embodiment as illustrated in FIG. 13, the second information (i.e., the rotation degree) and the third information (i.e., the symmetric relation) on the second block BL2 with respect to the first block BL1 are clearly shown. However, these will be described later in detail.

Subsequently, the optical proximity correction process may be performed on a reference block (i.e., the first block BL1) of the repetition blocks (S136). For example, the optical proximity correction process may be performed on the first block BL1 corresponding to a reference (or a basis) of the first information, the second information and the third information. The optical proximity correction process may be performed on each of the patches PA of the first block BL1.

Referring again to FIG. 11, the patches PA may be provided from the cluster controller 104 to the nodes 1121 to 112n of the processing system 110 through the bus 106, respectively. The optical proximity correction process may be performed dependently and in parallel on the patches PA by using the nodes 1121 to 112n. As a result, a turnaround time (TAT) necessary to perform the optical proximity correction process may be reduced.

Referring again to FIGS. 9 and 13, since the optical proximity correction process is performed, circuit patterns disposed in the patches PA may be biased. The detailed descriptions thereto may be the same or similar as described with reference to FIGS. 5 and 6. The patches PA of the first block BL1 may be corrected by the optical proximity correction process, thereby forming first correction patches PAa. For example, OPC bias of the first block BL1 (or biases of the patches PA of the first block BL1) may be obtained by the optical proximity correction process.

Figure 14:
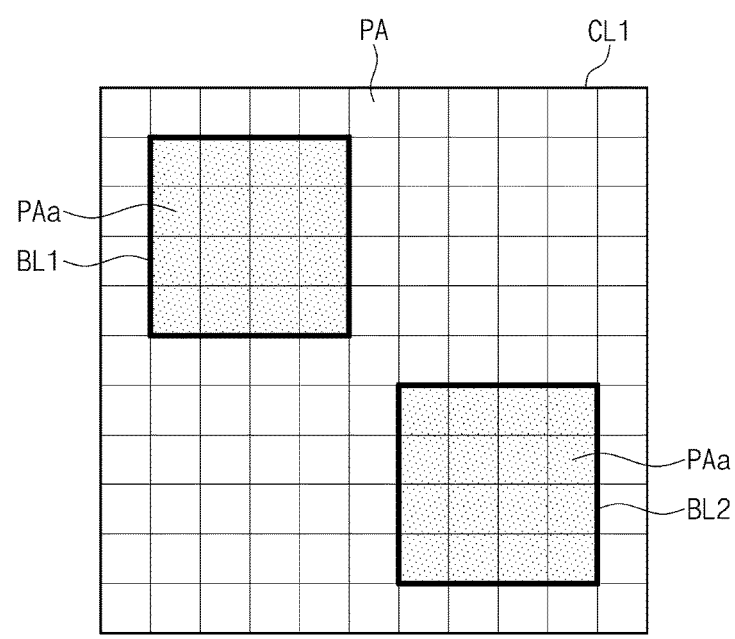

Referring to FIGS. 9 and 14, the OPC bias of the reference block (i.e., the first block BL1) may be applied to other repetition block (i.e., the second block BL2). For example, the first correction patches PAa of the first block BL1 may be applied to the patches PA of the second block BL2, respectively. Thus, the first correction patches PAa may constitute the second block BL2. All of the repetition blocks (i.e., the first and second blocks BL1 and BL2) may include the first correction patches PAa, and thus a first correction layout CL1 may be formed.

In some embodiments, applying the OPC bias of the first block BL1 to the second block BL2 may be performed using the first information, the second information, and the third information. For example, the first information may include information that the second block BL2 is spaced apart from the first block BL1 in one direction by one distance, e.g., a predetermined distance. The first correction patches PAa of the second block BL2 may be disposed at positions that are spaced apart from the first correction patches PAa of the first block BL1 in the one direction by the one distance.

Figure 15:
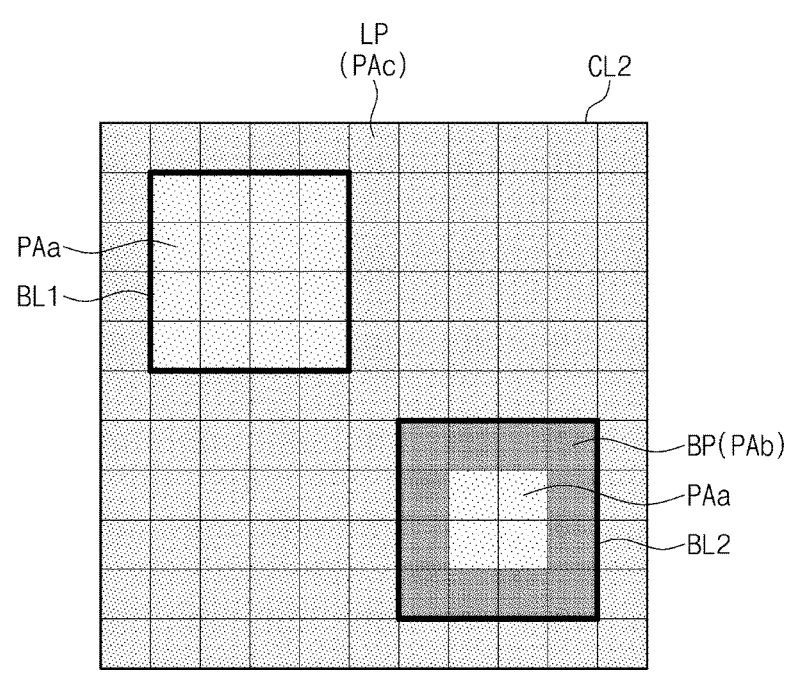

Referring to FIGS. 9 and 15, an optical proximity correction process may be performed on each of boundary patches BP of the other repetition block (i.e., the second block BL2). In addition, an optical proximity correction process may be performed on each of the patches PA of a remaining region (S138). The boundary patches BP may correspond to the patches that are located along the perimeter of each block (e.g., the first block BL1 and the second block BL2). In the exemplary embodiment as illustrated in FIG. 15, the boundary patches BP may be ones, overlapping with a boundary of the second block BL2, among the first correction patches PAa of the second block BL2. The patches PA of the remaining region may be patches PA constituting the remaining region except the first and second blocks BL1 and BL2 (see FIG. 14). Since the optical proximity correction process of the step S138 is performed, a second correction layout CL2 may be formed.

The optical proximity correction process of the boundary patches BP and the patches PA of the remaining region may be performed using the OPC tool 34 described above with reference to FIG. 11. The optical proximity correction process performed on each of the patches in the step S138 may be similar to the optical proximity correction process described with reference to FIGS. 11 and 13. In some embodiments, the optical proximity correction process may be performed on the boundary patches BP and the patches PA of the remaining region at the same time. In certain embodiments, the optical proximity correction process of the boundary patches BP and the optical proximity correction process of the patches PA of the remaining region may be sequentially performed. However, embodiments of the inventive concepts are not limited thereto.

In some embodiments, the optical proximity correction process of the boundary patches PAa may be performed with regard to peripheral patterns of the second block BL2. The peripheral patterns may be adjacent to the boundary of the second block BL2 and may be disposed outside the second block BL2.

The above optical proximity correction process of boundary patches of the first block BL1 may be performed in consideration of relation with peripheral patterns adjacent to the first block BL1. In some embodiments, a state of the peripheral patterns of the first block BL1 may be different from a state of the peripheral patterns of the second block BL2. Thus, the optical proximity correction process may be separately performed on the boundary patches BP of the second block BL2 to form second correction patches PAb. As a result, it is possible to reduce an optical distortion error that may occur due to the difference between a peripheral state of the first block BL1 and a peripheral state of the second block BL2.

In the second block BL1, the first correction patches PAa surrounded by the boundary patches BP may be spaced apart from the peripheral patterns so as not to be affected by the peripheral patterns. Thus, it may not be necessary to perform an additional optical proximity correction process on the first correction patches PAa of the second block BL2. For example, it is possible to substantially omit an optical proximity correction process of the patches (i.e., the first correction patches PAa) in the second block BL2 except the boundary patches BP. As a result, the TAT of the optical proximity correction process in the embodiments of the inventive concepts may be reduced, compared to a case in which the optical proximity correction is performed on all patches of the design layout LO2.

In some embodiments, the patches PA of the remaining region (e.g., the patches outside of the first and second blocks BL1 and BL2 in the second correction layout CL2) may be corrected by the optical proximity correction process, thereby forming third correction patches PAc. For example, OPC biases of the remaining region except the first and second blocks BL1 and BL2 (or OPC biases of the patches PA of the remaining region) may be obtained using the optical proximity correction process.

Subsequently, as described with reference to FIGS. 7 and 8, a photomask may be fabricated based on the second correction layout CL2, and patterns may be formed on a substrate by using the photomask.

Figure 16:
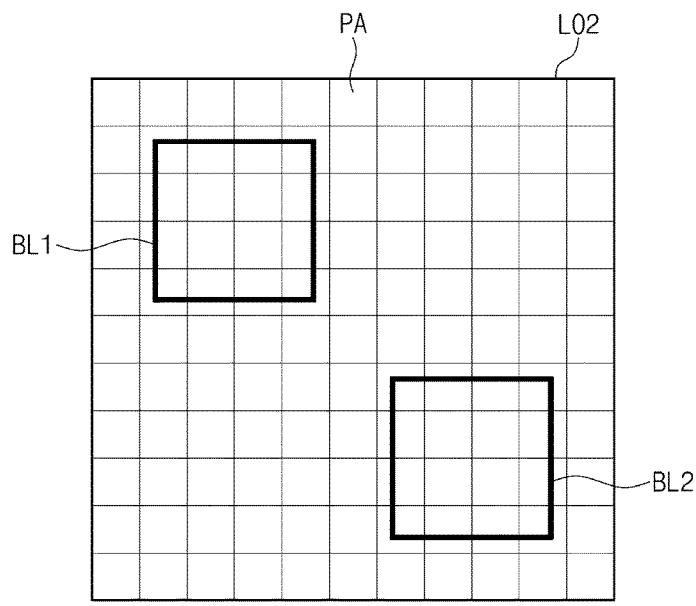
FIGS. 16 and 17 are diagrams illustrating layouts for explaining an optical proximity correction method according to some exemplary embodiments of the inventive concepts.
Figure 17:
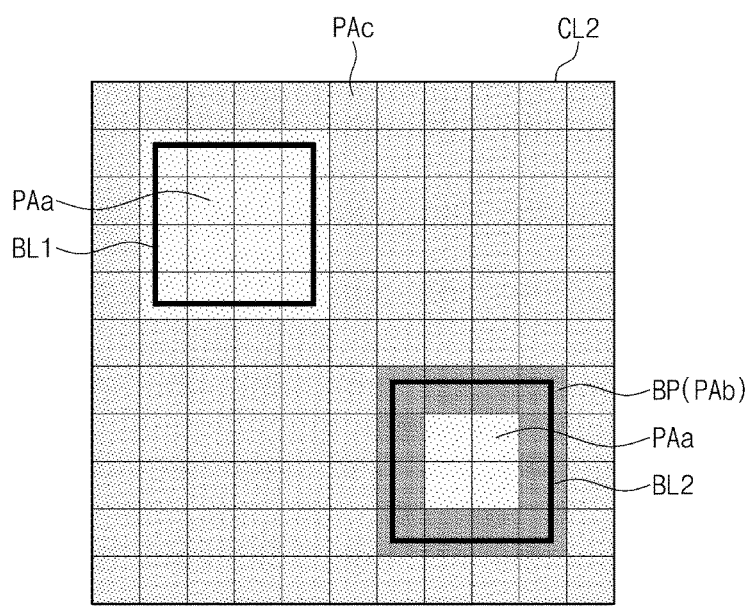

FIGS. 16 and 17 are diagrams illustrating layouts for explaining an optical proximity correction method according to some exemplary embodiments of the inventive concepts. In the present embodiment, the descriptions to the same technical features as in the embodiment of FIGS. 9 to 15 will be omitted or mentioned briefly for the purpose of ease and convenience in explanation. For example, differences between the present embodiment and the embodiment of FIGS. 9 to 15 will be mainly described hereinafter.

Referring to FIG. 16, a design layout LO2 including the first and second blocks BL1 and BL2 may be divided into a plurality of patches PA. Unlike FIG. 12, a boundary of the first block BL1 may intersect one or more patches PA, and a boundary of the second block BL2 may also intersect one or more patches PA. For example, a perimeter of the first block BL1 as illustrated in FIG. 12 may be larger than a perimeter of the first block BL1 as illustrated in FIG. 16. Similarly, a perimeter of the second block BL2 as illustrated in FIG. 12 may be larger than a perimeter of the second block BL2 as illustrated in FIG. 16. However, the disclosure is not limited thereto.

Referring to FIG. 17, optical proximity correction processes may be performed on the patches PA disposed in the first block BL1 and the patches PA which the boundary of the first block BL intersects, and thus first correction patches PAa may be formed. The first correction patches PAa may be applied to the second block BL2. In addition, an optical proximity correction process may be performed on each of boundary patches BP of the second block BL2 to form second correction patches PAb. The boundary patches BP may be patches PA, overlapping with the boundary of the second block BL2, among the patches (the first correction patches PAa) of the second block BL2 to which the first correction patches PAa of the first block BL1 is applied. An optical proximity correction process may be performed on each of the other patches except the first correction patches PAa and the second correction patches PAb, thereby forming third correction patches PAc.

FIGS. 18, 19, 21, 22, 24, and 25 are diagrams illustrating layouts for explaining an optical proximity correction method according to some exemplary embodiments of the inventive concepts. FIGS. 19, 21, 22, 24, and 25 illustrate some exemplary embodiments of the inventive concepts for explaining the optical proximity correction method of FIG. 9. FIG. 20A is an enlarged view of a region 'M(PA)' to illustrate a layout of a patch, FIG. 20B is an enlarged view of a layout of a cell CE of FIG. 20A, and FIG. 20C is a conceptual diagram illustrating a plurality of layout layers constituting the layout of FIG. 20A. FIG. 23 is a diagram illustrating a layout corrected by performing an optical proximity correction method on the cell layout of FIG. 20B. In the present embodiment, the descriptions to the same technical features as in the embodiment of FIGS. 9 to 15 will be omitted or mentioned briefly for the purpose of ease and convenience in explanation. For example, differences between the present embodiment and the embodiment of FIGS. 9 to 15 will be mainly described hereinafter.

Figure 18:
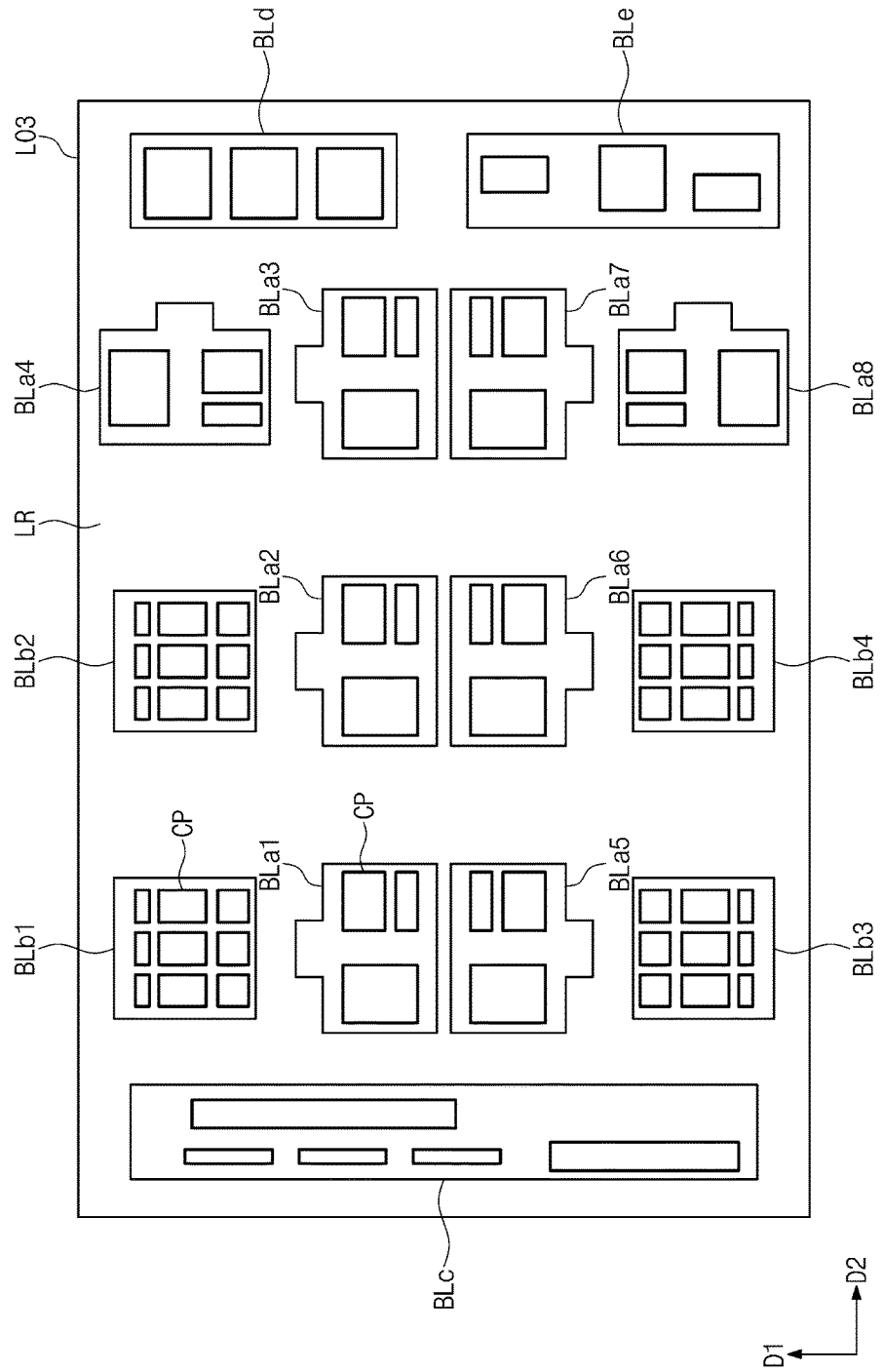
FIGS. 18, 19, 21, 22, 24, and 25 are diagrams illustrating layouts for explaining an optical proximity correction method according to some exemplary embodiments of the inventive concepts.

Referring to FIGS. 9 and 18, a design layout LO3 may be provided (S131). The design layout LO3 illustrated in FIG. 18 may be a full-chip layout of a semiconductor device. The design layout LO3 may include repetition blocks BLa1 to BLa8 and BLb1 to BLb4.

In detail, the repetition blocks BLa1 to BLa8 and BLb1 to BLb4 may include first repetition blocks BLa1 to BLa8 and second repetition blocks BLb1 to BLb4. The first repetition blocks BLa1 to BLa8 may include first to eighth central blocks BLa1 to BLa8. The second repetition blocks BLb1 to BLb4 may include first to fourth peripheral blocks BLb1 to BLb4. According to some embodiments of the inventive concepts, the first to eighth central blocks BLa1 to BLa8 may be memory regions, and the first to fourth peripheral blocks BLb1 to BLb4 may be core regions.

In some embodiments, each of the second, third, and fourth central blocks BLa2, BLa3, and BLa4 may be the same as the first central block BLa1. For example, shapes and arrangement relation of circuit patterns CP disposed in the first central block BLa1 may be the same as shapes and arrangement relation of circuit patterns CP disposed in each of the second, third, and fourth central blocks BLa2, BLa3, and BLa4. The first central block BLa1 and each of the fifth to eighth central blocks BLa5 to BLa8 may be symmetrical. For example, shapes and arrangement relation of the circuit patterns CP of the first central block BLa1 and shapes and arrangement relation of circuit patterns CP of each of the fifth to eighth central blocks BLa5 to BLa8 may be symmetrical.

In some embodiments, the second peripheral block BLb2 may be the same as the first peripheral block BLb1. For example, shapes and arrangement relation of circuit patterns CP disposed in the first peripheral block BLb1 may be the same as shapes and arrangement relation of circuit patterns CP disposed in the second peripheral block BLb2. The first peripheral block BLb1 and each of the third and fourth peripheral blocks BLb3 and BLb4 may be symmetrical. For example, shapes and arrangement relation of the circuit patterns CP of the first peripheral block BLb1 and shapes and arrangement relation of circuit patterns CP of each of the third and fourth peripheral blocks BLb3 and BLb4 may be symmetrical.

The design layout LO3 may also include a remaining region LR except the repetition blocks BLa1 to BLa8 and BLb1 to BLb4. The remaining region LR may include non-repetition blocks BLc, BLd, and BLe. In detail, the non-repetition blocks BLc, BLd, and BLe may include first to third non-repetition blocks BLc, BLd, and BLe. A block that is the same as or has symmetry with each of the first to third non-repetition blocks BLc, BLd, and BLe may not exist in the design layout LO3. For example, shapes and arrangement relation of circuit patterns CP disposed in the first non-repetition block BLc may be different from shapes and arrangement relation of circuit patterns CP disposed in the second non-repetition block BLd. The shapes and arrangement relation of the circuit patterns CP disposed in the second non-repetition block BLd may be different from shapes and arrangement relation of circuit patterns CP disposed in the third non-repetition block BLe. The shapes and arrangement relation of the circuit patterns CP disposed in the first non-repetition block BLc may be different from shapes and arrangement relation of circuit patterns CP disposed in the third non-repetition block BLe.

In some embodiments, even though not shown in the drawings, the rest of the remaining region LR except the non-repetition blocks BLc, BLd, and BLe may include circuit patterns CP therein.

Figure 19:
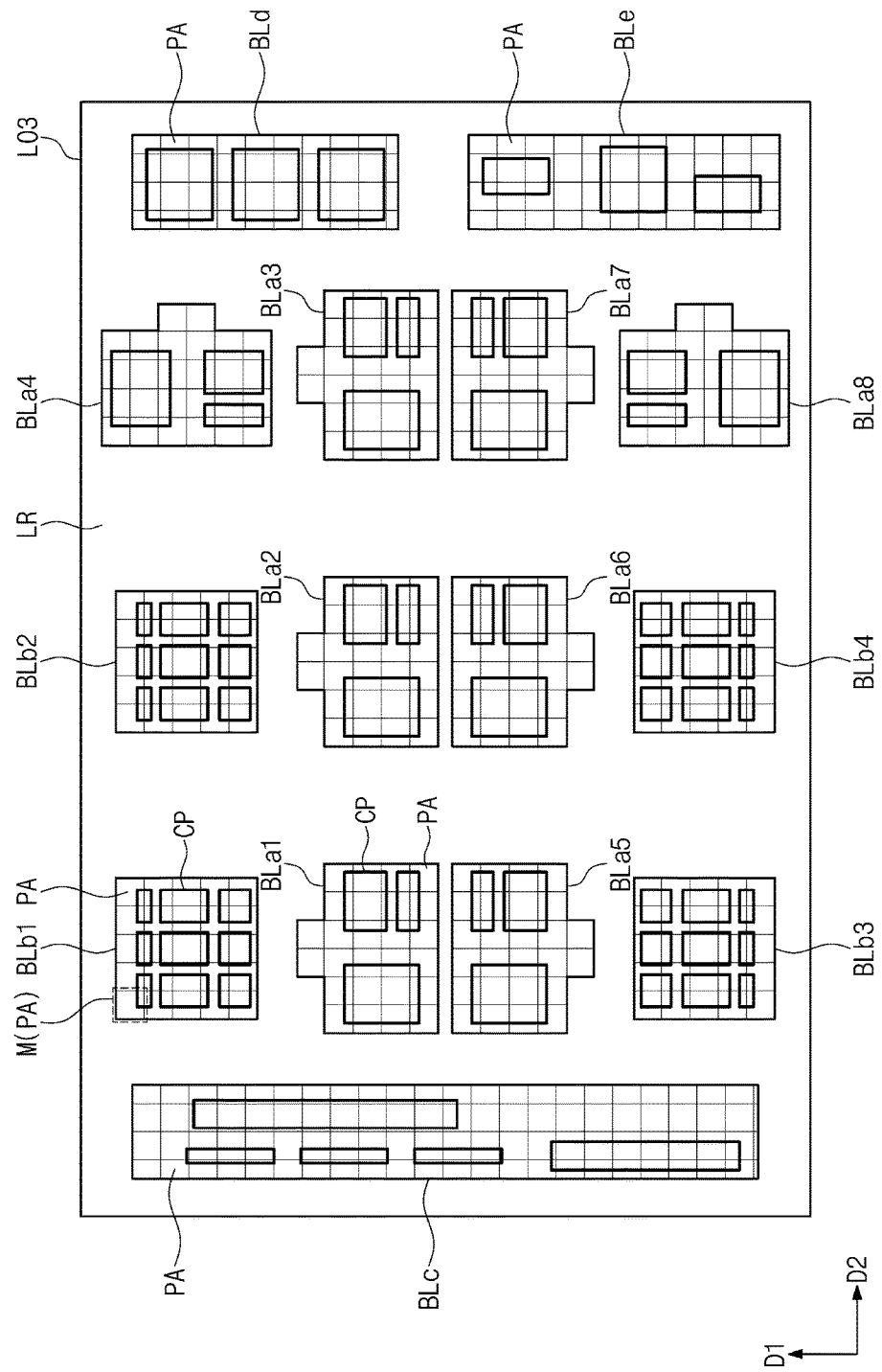
Figure 20A:
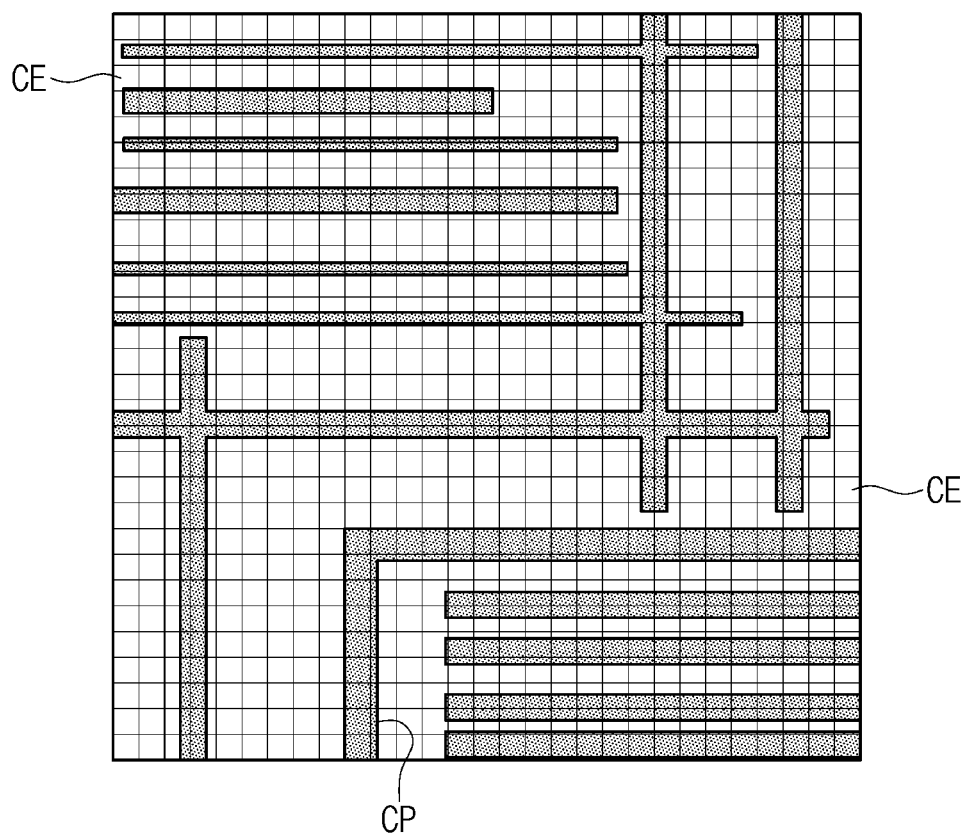
FIG. 20A is an enlarged view of a region 'M(PA)' to illustrate a layout of a patch.
Figure 20B:
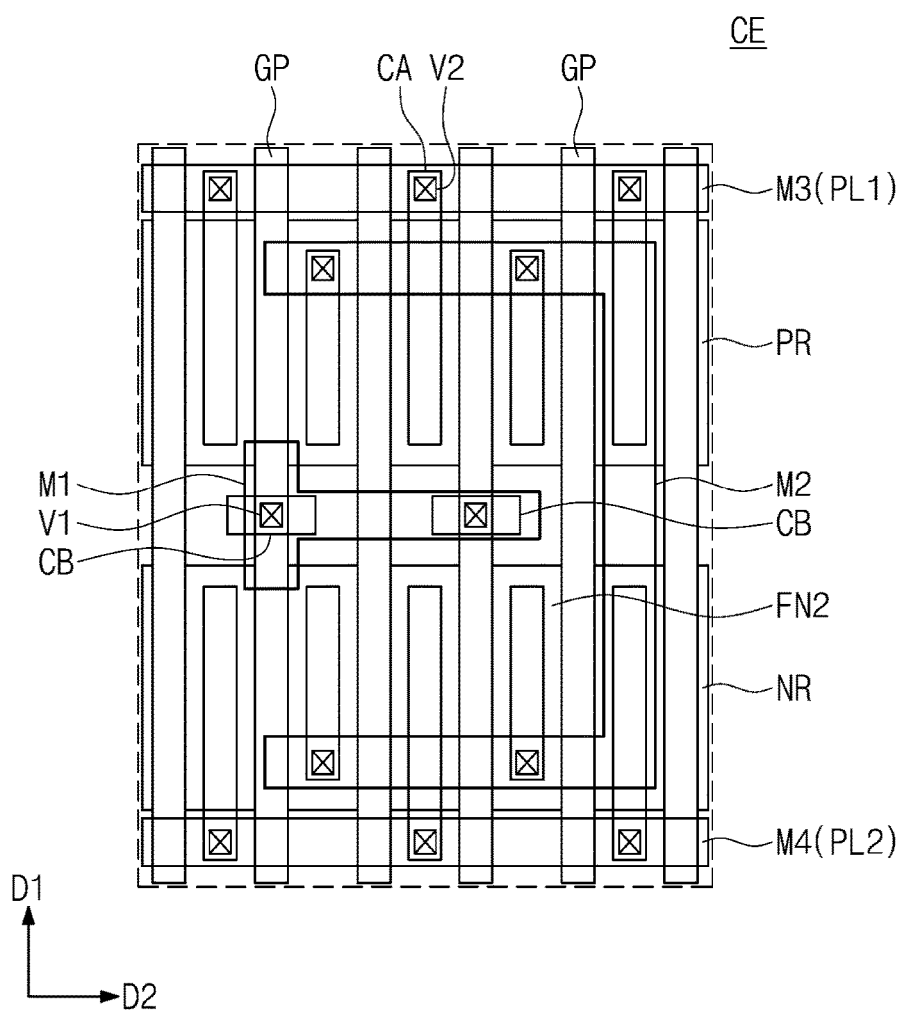
FIG. 20B is an enlarged view of a layout of a cell CE of FIG. 20A.
Figure 20C:
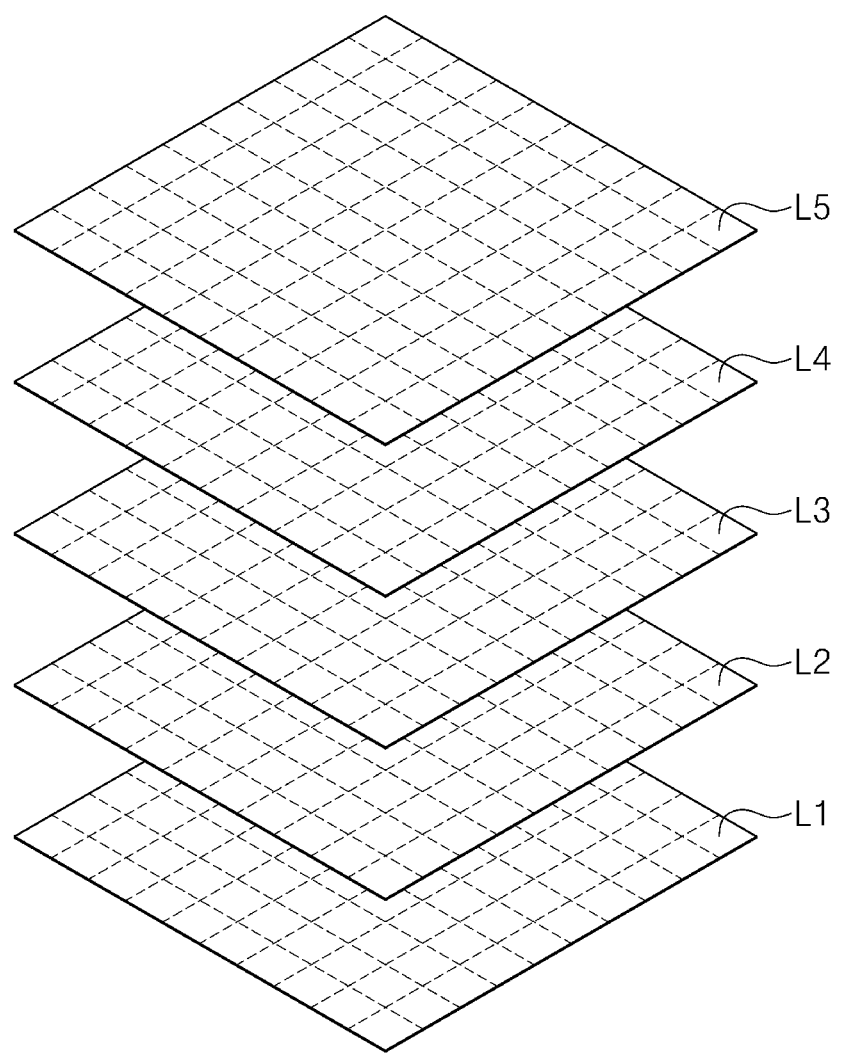
FIG. 20C is a conceptual diagram illustrating a plurality of layout layers constituting the layout of FIG. 20A.

Referring to FIGS. 9, 11, and 19, the design layout LO3 may be inputted into the OPC tool 34 (S132). Next, the design layout LO3 may be divided into a plurality of patches PA by using the OPC tool 34 (S133). The patches PA may have sizes that can be provided into the nodes 112_1 to 112_n of the OPC tool 34, respectively. For example, each of the patches PA may be a standard unit to which the optical proximity correction process is performed. In some embodiments, FIG. 19 illustrates the repetition blocks BLa1 to BLa8 and BLb1 to BLb4 and the non-repetition blocks BLc, BLd, and BLe, which are divided into a plurality of patches PA. However, the rest of the remaining region LR except the non-repetition blocks BLc, BLd, and BLe may also be divided into a plurality of patches. For example, the patches of the rest of the remaining region LR except the non-repetition blocks BLc, BLd, and BLe are omitted for the purpose of ease and convenience in explanation and illustration.

Referring to FIG. 20A, an enlarged layout of any one of the patches PA of the first peripheral block BLb1 is illustrated in FIG. 20A according to exemplary embodiments. The patch PA may include a plurality of cells CE. In addition, the patch PA may include a plurality of circuit patterns CP. A lot of patterns may be gathered together to constitute the circuit patterns CP, as illustrated in FIG. 20A.

Referring to FIG. 20B, an enlarged layout of one of the cells CE of the patch PA is illustrated in FIG. 20B. The cell CE may include the patterns constituting the circuit patterns CP. In some embodiments, the cell CE may be a layout of a logic cell. In detail, the cell CE may include a PMOS active pattern PR, an NMOS active pattern NR, gate patterns GP, active contact patterns CA, gate contact patterns CB, via patterns V1 and V2, and interconnection patterns M1, M2, M3, and M4.

The PMOS active pattern PR and the NMOS active pattern NR may be spaced apart from each other in a first direction D1. The gate patterns GP may extend in the first direction D1 to intersect the PMOS active pattern PR and the NMOS active pattern NR. The gate patterns GP may be spaced apart from each other in a second direction D2. The PMOS active pattern PR, the NMOS active pattern NR, and the gate patterns GP may define logic transistors to be formed on a semiconductor substrate.

The active contact patterns CA may be disposed to be connected to the PMOS active pattern PR and the NMOS active pattern NR. The gate contact patterns CB may be disposed to be connected to the gate patterns GP.

The interconnection patterns M1, M2, M3, and M4 may include first and second power lines PL1 and PL2 and first and second interconnection lines M1 and M2. The first and second power lines PL1 and PL2 may extend in the second direction D2. The first and second power lines PL1 and PL2 may be electrically connected to some of the active contact patterns CA through second via patterns V2. The first interconnection line M1 may be electrically connected to the gate contact patterns CB through first via patterns V1. The second interconnection line M2 may be electrically connected to others of the active contact patterns CA through second via patterns V2.

Even though not shown in the drawings, the layout of the cell CE may further include additional interconnection lines disposed on the interconnection patterns M1 to M4 and additional via patterns connecting the additional interconnection lines to the interconnection patterns M1 to M4.

Referring to FIG. 20C, the layout of the cell CE of FIG. 20B may include a plurality of layout layers L1 to L5. In some embodiments, the layout layers L1 to L5 may include first to fifth layout layers L1 to L5. Although not shown in FIG. 20C, in some embodiments, the first layout layer L1 may include the PMOS active pattern PR and the NMOS active pattern NR. The second layout layer L2 may include the gate patterns GP. The third layout layer L3 may include the active contact patterns CA and the gate contact patterns CB. The fourth layout layer L4 may include the via patterns V1 and V2. The fifth layout layer L5 may include the interconnection patterns M1, M2, M3, and M4.

Figure 21:
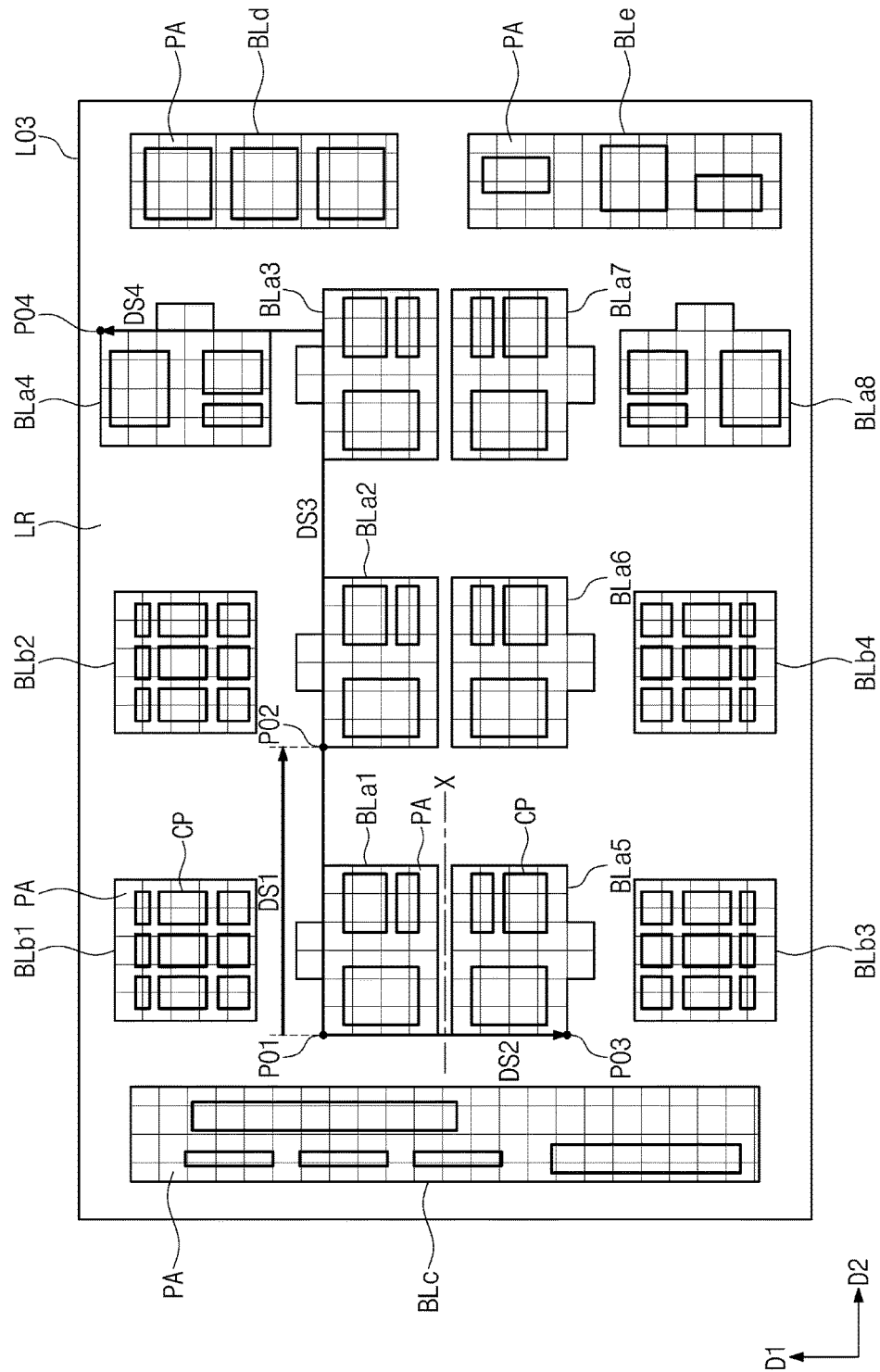

Referring to FIGS. 9 and 21, whether repetition blocks exist in the design layout LO3 may be checked (S134). As described above, information on the repetition blocks may be included in the layout design data. As a result, it may be checked or verified that the first to eighth central blocks BLa1 to BLa8 are the first repetition blocks BLa1 and BLa8 and the first to fourth peripheral blocks BLb1 to BLb4 are the second repetition blocks BLb1 to BLb4.

Next, position relation, rotation relation, and symmetric relation between the repetition blocks may be verified (S135). In some embodiments, position information (first information), rotation information (second information), and symmetric information (third information) of the second central block BLa2 with respect to the first central block BLa1 may be verified and obtained. The first central block BLa1 may have a first point PO1, and the second central block BLa2 may have a second point PO2 corresponding in position to the first point PO1. In this exemplary embodiment, it may be verified that a distance between the first point PO1 and the second point PO2 is a first distance DS1 in the second direction D2. For example, the position information (the first information) of the second central block BLa2 with respect to the first central block BLa1 may be obtained. In some embodiments, it may be verified that the second central block BLa2 has the same shape as the first central block BLa1 and is not rotated or symmetric with respect to the first central block BLa1. For example, the rotation information (the second information) and the symmetric information (the third information) of the second central block BLa2 with respect to the first central block BLa1 may be obtained.

In certain embodiments, position information (first information), rotation information (second information), and symmetric information (third information) of the fifth central block BLa5 with respect to the first central block BLa1 may be verified and obtained. The first central block BLa1 may have the first point PO1, and the fifth central block BLa5 may have a third point PO3 corresponding in position to the first point PO1. In this exemplary embodiment, it may be verified that a distance between the first point PO1 and the third point PO3 is a second distance DS2 in a direction opposite to the first direction D1. For example, the position information (the first information) of the fifth central block BLa5 with respect to the first central block BLa1 may be obtained. In some embodiments, it may be verified that the fifth central block BLa5 and the first central block BLa1 are symmetrical with respect to a line X parallel to the second direction D2. In addition, it may be verified that the fifth central block BLa5 is not rotated with respect to the first central block BLa1. For example, the rotation information (the second information) and the symmetric information (the third information) of the fifth central block BLa5 with respect to the first central block BLa1 may be obtained.

In certain embodiments, position information (first information), rotation information (second information), and symmetric information (third information) of the fourth central block BLa4 with respect to the first central block BLa1 may be verified and obtained. The first central block BLa1 may have the first point PO1, and the fourth central block BLa4 may have a fourth point PO4 corresponding in position to the first point PO1. In this exemplary embodiment, it may be verified that a distance between the first point PO1 and the fourth point PO4 has a third distance DS3 in the second direction D2 and a fourth distance DS4 in the first direction D1. For example, the position information (the first information) of the fourth central block BLa4 with respect to the first central block BLa1 may be obtained. In addition, it may be verified that the fourth and first central blocks BLa4 and BLa1 are not symmetrical and the fourth central block BLa4 has the same shape as the first central block BLa1. However, it may be verified that the fourth central block BLa4 has a shape of the first central block BLa1 rotated clockwise by 90 degrees. For example, the rotation information (the second information) and the symmetric information (the third information) of the fourth central block BLa4 with respect to the first central block BLa1 may be obtained.

First information, second information and third information may be obtained from the other repetition blocks except the aforementioned repetition blocks on the basis of a reference block (e.g., the first central block BLa1 or the first peripheral block BLb1).

Figure 22:
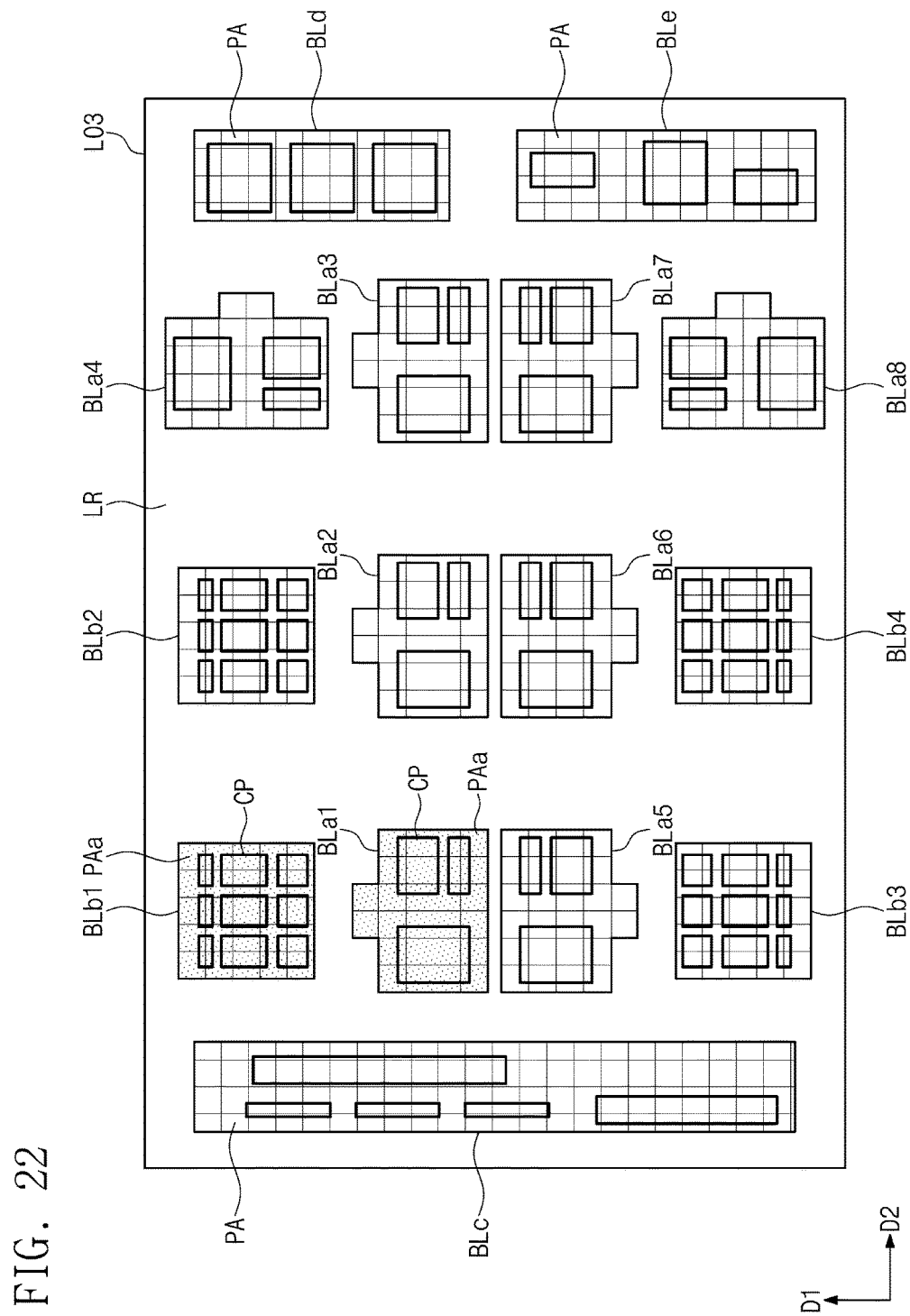
Figure 23:
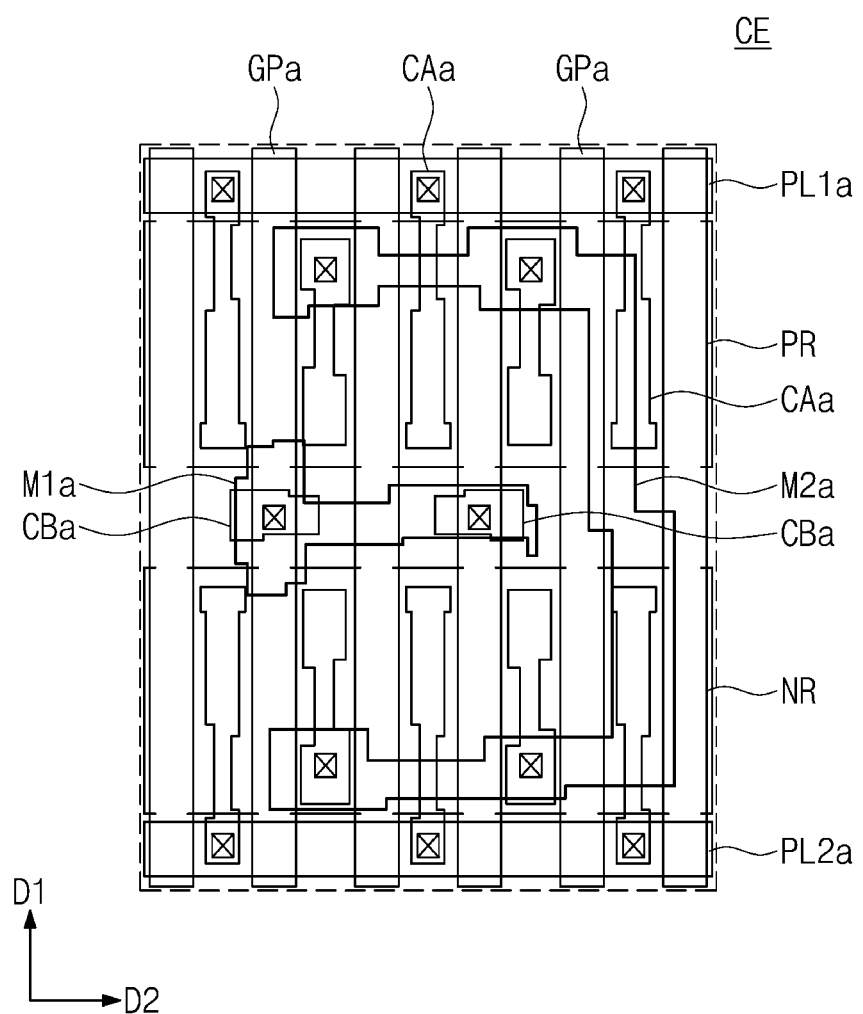
FIG. 23 is a diagram illustrating a layout corrected by performing an optical proximity correction method on the cell layout of FIG. 20B.

Referring to FIGS. 9 and 22, an optical proximity correction process may be performed on the reference blocks (i.e., the first central block BLa1 and the first peripheral block BLb1) (S136). In detail, the optical proximity correction process may be performed on each of the patches PA of the first central block BLa1 and the first peripheral block BLb1. The optical proximity correction process may be performed using the OPC tool 34 of FIG. 11. Thus, the patches PA of each of the first central block BLa1 and the first peripheral block BLb1 may be corrected to form first correction patches PA.

Since the optical proximity correction process is performed, the circuit patterns of each of the patches PA may be biased. In detail, referring to FIG. 23, the layout of the cell CE of FIG. 20B may be biased by the optical proximity correction process, and thus a corrected layout of the cell CE may be formed. In this exemplary embodiment, as described with reference to FIG. 20C, the cell CE may include the layout layers L1 to L5. The cell CE may be divided into the layout layers L1 to L5, and the optical proximity correction process may be performed on each of the layout layers L1 to L5. In this exemplary embodiment, as described with reference to FIGS. 5 and 6, the circuit patterns included in each of the layout layers L1 to L5 may be divided into a plurality of segments, and the divided segments may be biased. Thereafter, corrected layout layers L1 to L5 may be merged with each other to form the corrected layout of the cell CE.

For example, the gate patterns GP of the second layout layer L2 may be biased to form corrected gate patterns GPa having increased widths. The active contact patterns CA and the gate contact patterns CB of the third layout layer L3 may be biased to form corrected active contact patterns CAa and corrected gate contact patterns CBa, which have complex polygonal shapes. The power lines PL1 and PL2 of the fifth layout layer L5 may be biased to form corrected power lines PL1a and PL2a having increased widths. In addition, the interconnection lines M1 and M2 of the fifth layout layer L5 may be biased to form corrected interconnection lines M1a and M2a having complex polygonal shapes.

Figure 24:
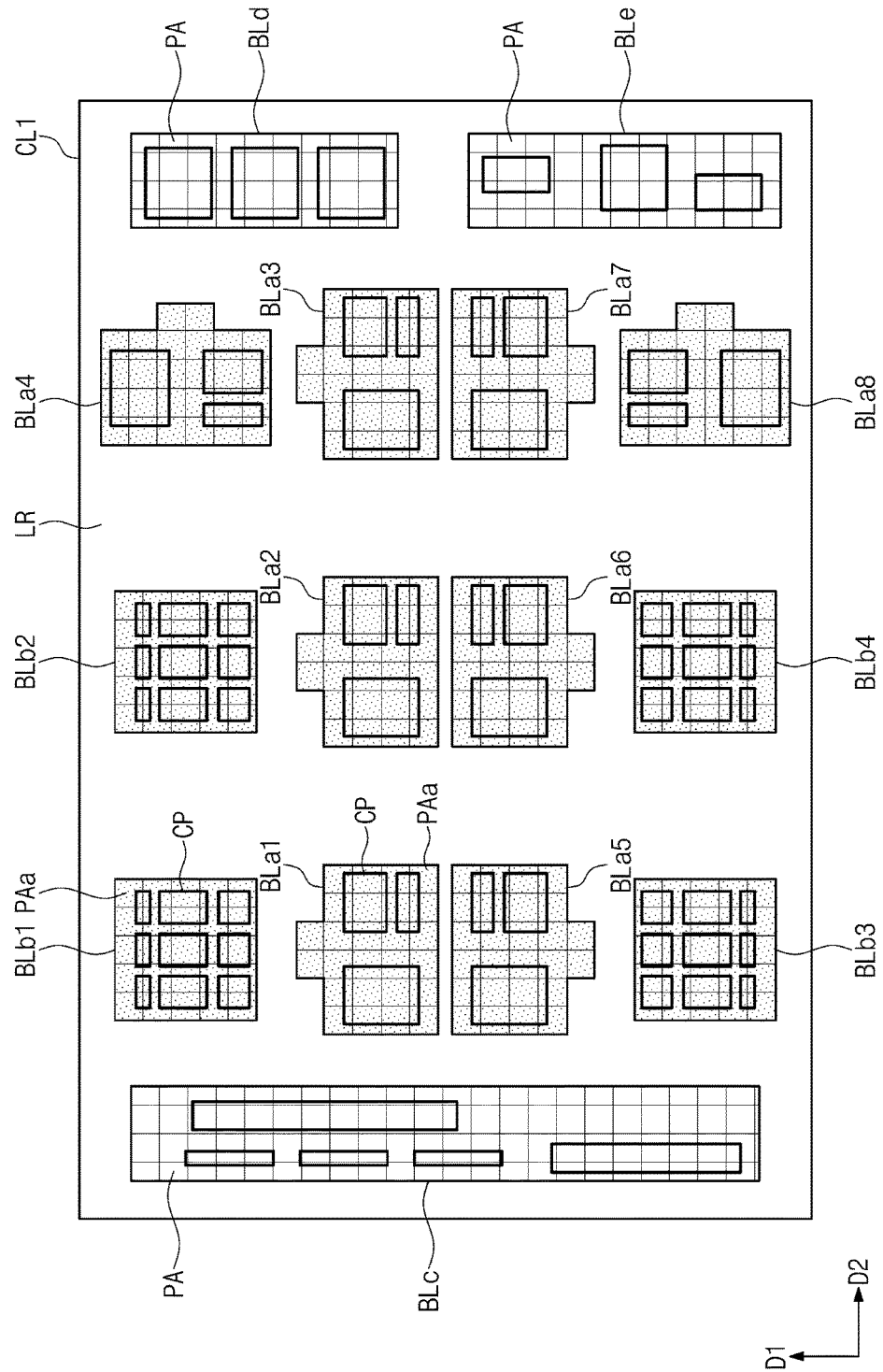

Referring to FIGS. 9 and 24, the OPC bias of the first central block BLa1 may be applied to the other first repetition blocks BLa2 to BLa8, and the OPC bias of the first peripheral block BLb1 may be applied to the other second repetition blocks BLb2 to BLb4 (S137). For example, the first correction patches PAa of the first central block BLa1 may be applied to the patches PA of each of the second to eighth central blocks BLa2 to BLa8, respectively. The first correction patches PAa of the first peripheral block BLb1 may be applied to the patches PA of each of the second to fourth peripheral blocks BLb2 to BLb4, respectively. All of the first repetition blocks BLa1 to BLa8 and all of the second repetition blocks BLb1 and BLb4 may include the first correction patches PAa, and thus a first correction layout CL1 may be formed.

In some embodiments, applying the OPC bias of the first central block BLa1 to the second to eighth central blocks BLa2 to BLa8 may be performed using the first information (position information), the second information (rotation information), and the third information (symmetric information).

In some embodiments, according to the first information (position information), the second information (rotation information), and the third information (symmetric information) of the second central block BLa2, the second central block BLa2 is spaced apart from the first central block BLa1 in the second direction D2 by the first distance DS1 (see FIG. 21). In addition, the second central block BLa2 may have the same shape as the first central block BLa1. Thus, each of the first correction patches PAa of the first central block BLa1 may be moved in the second direction D2 by the first distance DS1, thereby defining each of the first correction patches PAa of the second central block BLa2.

In certain embodiments, according to the first information (position information), the second information (rotation information), and the third information (symmetric information) of the fifth central block BLa5, the fifth central block BLa5 is spaced apart from the first central block BLa1 in the direction opposite to the first direction D1 by the second distance DS2. In addition, the fifth central block BLa5 and the first central block BLa1 are symmetrical with respect to the line X parallel to the second direction D2 (see FIG. 21). Thus, each of the first correction patches PAa of the first central block BLa1 may be mirrored with respect to the line X (i.e., a symmetry axis) of the second direction D2. Each of the mirrored first correction patches PAa may be spaced apart from a corresponding one of the first correction patches PAa of the first central block PAa in the direction opposite to the first direction D1 by the second distance DS2.

In certain embodiments, according to the first information (position information), the second information (rotation information), and the third information (symmetric information) of the fourth central block BLa4, the fourth central block BLa4 is spaced apart from the first central block BLa1 by the third distance DS3 in the second direction D2 and the fourth distance DS4 in the first direction D1. In addition, the fourth central block BLa4 has the shape of the first central block BLa1 rotated clockwise by 90 degrees (see FIG. 21). Thus, each of the first correction patches PAa of the first central block BLa1 may be rotated clockwise by 90 degrees. Each of the rotated first correction patches PAa may be moved in the second direction D2 by the third distance DS3 and may be then moved in the first direction D1 by the fourth distance DS4, thereby defining each of the first correction patches PAa of the fourth block BLa4.

The OPC bias of the corrected reference block (e.g., the first central block BLa1 or the first peripheral block BLb1) may be applied to the other repetition blocks except the repetition blocks described above. In this exemplary embodiment, the first information (position information), the second information (rotation information), and the third information (symmetric information) on each of the other repetition blocks may be used identically or similarly to the first information (position information), the second information (rotation information), and the third information (symmetric information) of the repetition bocks described above.

Figure 25:
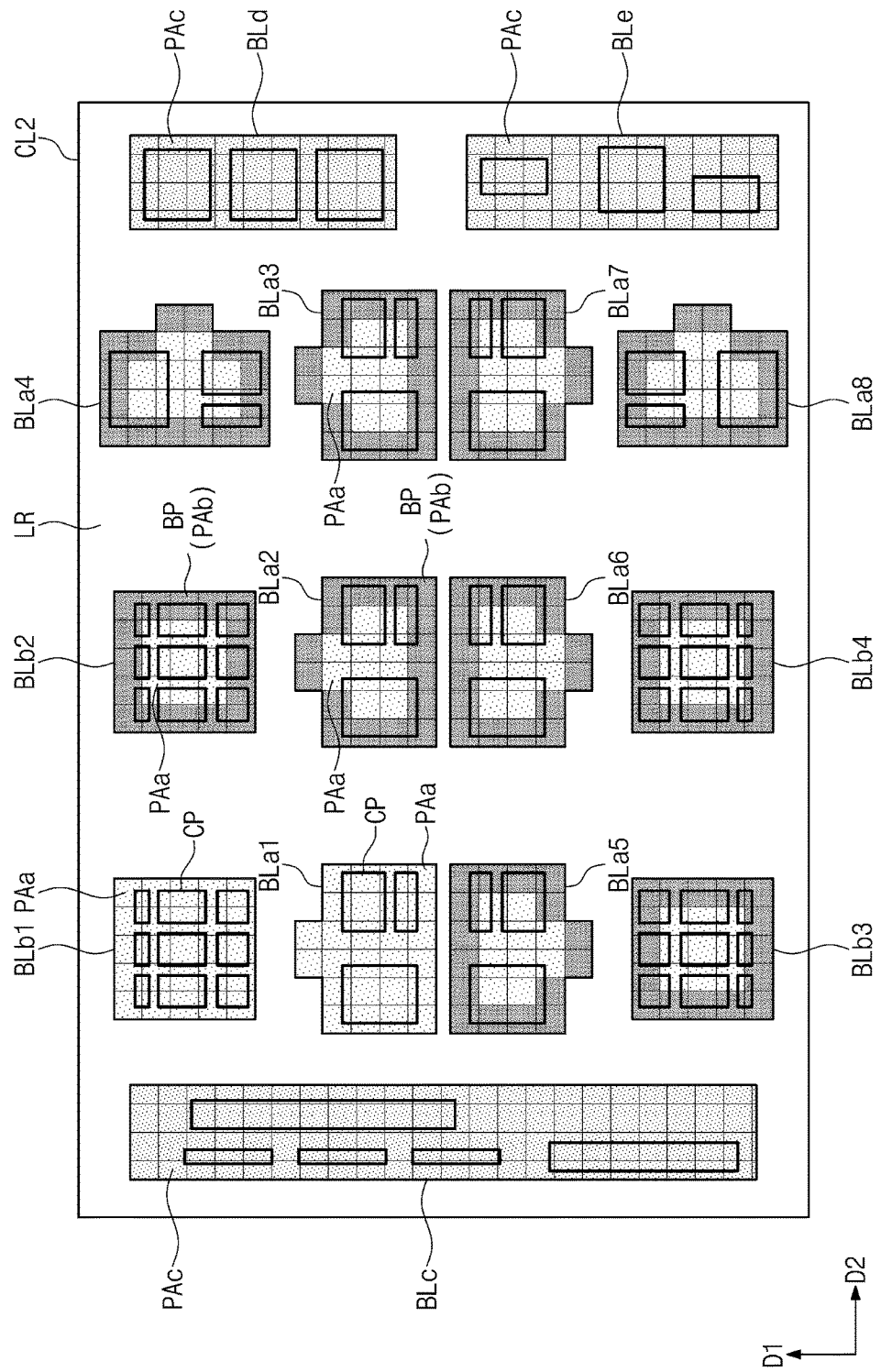

Referring to FIGS. 9 and 25, an optical proximity correction process may be performed on each of boundary patches BP of each of the other first repetition blocks BLa2 to BLa8, and an optical proximity correction process may be performed on each of boundary patches BP of each of the other second repetition blocks BLb2 to BLb4. In addition, an optical proximity correction process may be performed on each of patches of the remaining region LR (S138). The patches of the remaining region LR may include the patches PA of the non-repetition blocks BLc, BLd, and BLe and patches (not shown) of the rest of the remaining region LR except the non-repetition blocks BLc, BLd, and BLe. Since the optical proximity correction process of the step S138 is performed, a second correction layout CL2 may be formed.

The optical proximity correction process may be performed on the boundary patches BP of each of the other repetition blocks BLa2 to BLa8 and BLb2 to BLb4 with regard to peripheral patterns adjacent to the boundary patches BP, thereby forming a second correction patches PAb. Also, the optical proximity correction process may be performed on the patches of the remaining region LR, thereby forming third correction patches PAc. The second and third correction patches PAb and PAc may be formed by the same or similar method as described with reference to FIGS. 9 and 15.

An optical proximity correction process may not be performed on the first correction patches PAa disposed within each of the second to eighth central blocks BLa2 to BLa8 and second to fourth peripheral blocks BLb2 to BLb4. As a result, a TAT of the optical proximity correction process performed in the embodiments of the inventive concepts may be reduced, compared to a case in which the optical proximity correction is performed on all the patches PA of the design layout LO3.

Subsequently, as described with reference to FIGS. 7 and 8, a photomask may be fabricated based on the second correction layout CL2, and patterns may be formed on a substrate by using the photomask according to exemplary embodiments.

In the method for manufacturing a semiconductor device according to some embodiments of the inventive concepts, the same OPC bias may be applied to the repetition blocks. Thus, it is possible to reduce a performing time (e.g., the turnaround time; TAT) of the optical proximity correction process. In addition, the optical proximity correction process may be additionally performed on the boundary portions of the repetition blocks, thereby reducing the optical distortion error.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A method for manufacturing a semiconductor device, the method comprising:
    obtaining a design layout for a target layer of an optical proximity correction process, the design layout including a first block and a second block being a repetition block of the first block;
    dividing the design layout into a plurality of patches;
    performing the optical proximity correction process on the patches of the first block;
    applying corrected patches of the first block to the patches of the second block, respectively;
    forming a correction layout by performing the optical proximity correction process on boundary patches of the second block;
    fabricating a photomask corresponding to the correction layout; and
    forming patterns on a substrate corresponding to the photomask,
    wherein each of the patches is a standard unit on which the optical proximity correction process is performed.

2. The method of claim 1, wherein a shape of the second block is the same as a shape of the first block.

3. The method of claim 1, wherein the second block and the first block are symmetrical.

4. The method of claim 1, wherein at least one of the patches includes a plurality of cells, and
    wherein at least one of the cells includes a plurality of layout patterns constituting a circuit of the cell.

5. The method of claim 4, wherein the layout patterns comprise:
    a first layer including an active pattern;
    a second layer including a gate pattern; and
    a third layer including an interconnection pattern,
    wherein the optical proximity correction process of the patches of the first block is performed on each of the first to third layers.

6. The method of claim 1, further comprising:
    obtaining information on repetition blocks from the design layout to check whether the second block is a repetition block of the first block.

7. The method of claim 1, wherein the performing of the optical proximity correction process on the patches of the first block comprises:
    dividing each of a plurality of layout patterns included in each of the patches into a plurality of segments; and
    biasing one or more of the segments.

8. The method of claim 1, wherein the optical proximity correction process is performed using an optical proximity correction (OPC) tool, and
    wherein each of the patches is provided into a corresponding node of a plurality of nodes included in a processing system of the OPC tool, when the optical proximity correction process is performed.

9. The method of claim 8, wherein the nodes include process cores processing data.

10. The method of claim 1, further comprising:
    obtaining first information on a position of the second block with respect to the first block;
    obtaining second information on a rotation degree of the second block with respect to the first block; and
    obtaining third information on symmetric relation between the first and second blocks with respect to the first block,
    wherein the corrected patches of the first block are respectively applied to the patches of the second block on the basis of the first information, the second information, and the third information.

11. The method of claim 1, wherein the boundary patches are patches, overlapping with a boundary of the second block, among the patches of the second block to which the corrected patches of the first block are applied.

12. The method of claim 1, wherein the forming of the correction layout further comprises: performing the optical proximity correction process on the patches of a remaining region of the design layout except the first and second blocks.

13. A method for manufacturing a semiconductor device, the method comprising:
providing a design layout, the design layout including a first block and a second block being a repetition block of the first block;
performing an optical proximity correction process on the first block to obtain an optical proximity correction (OPC) bias of the first block;
applying the OPC bias to the second block to form a first correction layout, wherein a corrected layout of the second block and a corrected layout of the first block are substantially the same as each other or are symmetrical to each other;
forming a second correction layout by performing an optical proximity correction process on a boundary portion of the second block and a remaining region of the first correction layout except the first and second blocks;
fabricating a photomask corresponding to the second correction layout; and
forming a pattern on a substrate corresponding to the photomask.

14. The method of claim 13, further comprising:
dividing the design layout into a plurality of patches before the performing of the optical proximity correction process on the first block,
wherein each of the patches is a standard unit on which the optical proximity correction process is performed.

15. The method of claim 13, further comprising:
obtaining position information, rotation information, and symmetry information of the second block with respect to the first block,
wherein the applying of the OPC bias to the second block is performed using the position information, the rotation information, and the symmetry information.

16. The method of claim 13, wherein the remaining region includes a third block, and
wherein the third block is a non-repetition block having a size or shape different from that of the first block or the second block.

17. A method for manufacturing a semiconductor device, the method comprising:
providing a design layout, the design layout including a first block and a second block;
dividing the design layout into a plurality of patches;
determining whether the second block is a repetition block of the first block based on verifying positional, rotational, and symmetric relations between the first block and the second block;
performing an optical proximity correction process on the patches of the first block;
applying corrected patches of the first block to the patches of the second block, respectively, by using the verified positional, rotational, and symmetric relations between the first block and the second block;
forming a correction layout by performing an optical proximity correction process on boundary patches of the second block;
fabricating a photomask corresponding to the correction layout; and
forming patterns on a substrate corresponding to the photomask.

18. The method of claim 17, wherein the boundary patches are patches, overlapping with a boundary of the second block, among the patches of the second block to which the corrected patches of the first block are applied, and
wherein the forming a correction layout comprises performing an optical proximity correction process only on the boundary patches of the second block and omitting an optical proximity correction process on the patches that are not the boundary patches included in the second block.

19. The method of claim 17, wherein the forming of the correction layout further comprises: performing the optical proximity correction process on the patches of a remaining region of the design layout except the first and second blocks.

20. The method of claim 19, wherein the optical proximity correction process is performed simultaneously on the boundary patches and the patches of the remaining region.

* * * * *